US012666771B2

(12) United States Patent
Hsu et al.

(10) Patent No.: US 12,666,771 B2
(45) Date of Patent: Jun. 23, 2026

(54) TRANSMISSIVE DISPLAY DEVICE

(71) Applicant: AUO Corporation, Hsinchu (TW)

(72) Inventors: Jia Hao Hsu, Hsinchu (TW); Yutang Tsai, Hsinchu (TW); Kun-Cheng Tien, Hsinchu (TW); Shu-Hao Huang, Hsinchu (TW)

(73) Assignee: AUO Corporation, Hsinchu (TW)

( * ) Notice: Subject to any disclaimer, the term of this patent is extended or adjusted under 35 U.S.C. 154(b) by 440 days.

(21) Appl. No.: 18/523,914

(22) Filed: Nov. 30, 2023

(65) Prior Publication Data

US 2024/0372048 A1     Nov. 7, 2024

(30) Foreign Application Priority Data

May 3, 2023     (TW) ................................. 112116497

(51) Int. Cl.
*H10H 20/855*     (2025.01)
*H10W 90/00*     (2026.01)
(52) U.S. Cl.
CPC .......... *H10H 20/855* (2025.01); *H10W 90/00* (2026.01)
(58) Field of Classification Search
None
See application file for complete search history.

(56) References Cited

U.S. PATENT DOCUMENTS

| | | | |
|---|---|---|---|
| 2020/0041099 A1* | 2/2020 | Fukuda | .................. H10K 59/35 |
| 2022/0310976 A1* | 9/2022 | Lee | ......................... H10W 90/00 |
| 2023/0178693 A1* | 6/2023 | Yoon | .................. H10H 20/8514 |
| 2023/0335542 A1 | 10/2023 | Tamaki | |

FOREIGN PATENT DOCUMENTS

| | | |
|---|---|---|
| TW | 202244868 | 11/2022 |
| TW | I807616 | 7/2023 |
| WO | 2022054699 | 3/2022 |

OTHER PUBLICATIONS

E3Displays, "Achieve advanced clarity and maximum durability.", retrieved on Nov. 29, 2023, pp. 1-12, Available at: https://www.e3displays.com/optical-bonding/.

* cited by examiner

*Primary Examiner* — Hung K Vu
(74) *Attorney, Agent, or Firm* — JCIPRNET

(57) ABSTRACT

A transmissive display device includes a circuit substrate, pixel units, first light-shielding structures, a transparent covering layer, a hole filling portion and a cover lens. Each pixel unit includes light emitting diodes. Each first light-shielding structure is disposed corresponding to a corresponding one of the pixel units. Each first light-shielding structure defines first light-transmissive regions. The first light-transmissive regions overlap the light-emitting diodes of the corresponding one of the pixel units. The transparent covering layer surrounds the first light shielding structures. The transparent covering layer has holes. Each hole is located in a corresponding one of the first transparent regions. The hole filling portion is located in the holes.

10 Claims, 22 Drawing Sheets

1

210a(210)

8

TRANSMISSIVE DISPLAY DEVICE

CROSS-REFERENCE TO RELATED APPLICATION

This application claims the priority benefit of Taiwan application serial no. 112116497, filed on May 3, 2023. The entirety of each of the above-mentioned patent applications is hereby incorporated by reference herein and made a part of this specification.

BACKGROUND

Technical Field

The present invention relates to a transmissive display device.

Description of Related Art

The transmissive display device is a type of display that simultaneously transmits light and displays images. When using the transmissive display device, users can not only view the image displayed on the display device, but also see what's behind the display device through it. Therefore, transmissive display devices are often utilized in windows or other objects that require light transmission.

Generally speaking, the interface between the cover lens of the transmissive display device and the air may reflect the light emitted by the light-emitting elements in the transmissive display device, causing backside light leakage problems in the display device.

SUMMARY

The present invention provides a transmissive display device that can improve the problem of backside light leakage.

At least one embodiment of the present invention provides a transmissive display device, which comprises a circuit substrate, a plurality of pixel units, a plurality of first light-shielding structures, a transparent covering layer, a hole filling portion and a cover lens. The circuit substrate comprises a transmissive region and a non-transmissive region. The Pixel units are disposed on the non-transmissive region. Each pixel unit includes a plurality of light-emitting diodes (LEDs). Each first light-shielding structure is disposed corresponding to a corresponding one of the pixel units. Each first light-shielding structure defines a plurality of first transparent regions. The first transparent regions are overlapping with the LEDs in the corresponding one of the pixel units. The transparent covering layer surrounds the first light-shielding structures. The transparent covering layer has a plurality of holes. Each hole is located in a corresponding one of the first transparent regions. The hole filling portion is located in the hole. The cover lens is overlapping with the circuit substrate. The first light-shielding structure is located between the cover lens and circuit substrate. The refractive index of the transparent covering layer is 1.44 to 1.55. The hole filling portion includes vacuum, air or optical clear resin (OCR), and the refractive index of the hole filling portion is 1 to 1.3. The refractive index of the cover lens is 1.45 to 1.55.

DESCRIPTION OF THE EMBODIMENTS

Figure 1:
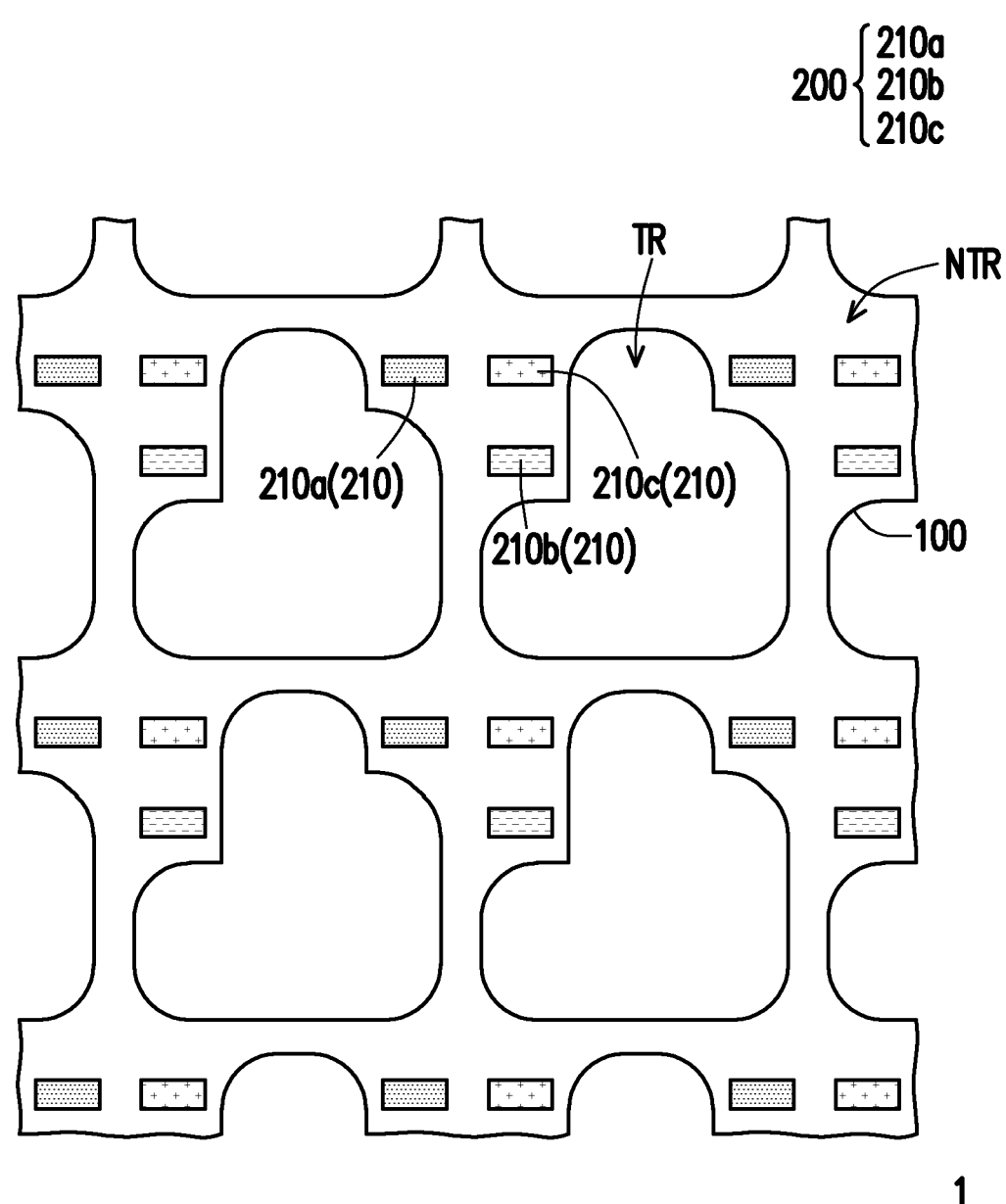
FIG. 1 is a schematic top view of a transmissive display device according to an embodiment of the present invention.

FIG. 1 is a schematic top view of a transmissive display device 1 according to an embodiment of the present invention. For the sake of clarity, FIG. 1 illustrates the circuit substrate 100 of the transmissive display device 1 and a plurality of pixel units 200 located on the circuit substrate 100, and other components are omitted.

Referring to FIG. 1, the circuit substrate 100 includes a transmissive region TR and a non-transmissive region NTR. More specifically, there is a plurality of transmissive regions TR in a mesh-like non-transmissive region NTR. Conductive materials, semiconductor materials or other opaque materials are disposed in the non-transmissive region NTR. Transparent materials are disposed in the non-transmissive region NTR.

A plurality of pixel units 200 are disposed on the non-transmissive region NTR and is electrically connected to the circuit substrate 100. In this embodiment, a single pixel unit 200 comprises a plurality of LEDs 210 disposed adjacently. In this embodiment, a single pixel unit 200 has three LEDs 210, which are a red LED 210a, a green LED 210b and a blue LED 210c. In this embodiment, a single pixel unit 200 has three LEDs 210, which are respectively a red LED 210a, a green LED 210b, and a blue LED 210c. The positions of the red LED 210a, the green LED 210b, and the blue LED 210c can be adjusted according to the needs. Additionally, in some embodiments, a single pixel unit 200 can also include multiple light-emitting diodes of a single color, and use color conversion materials (such as quantum dot materials, fluorescent materials, dyes, perovskite materials, or other similar materials) to emit light of different colors.

Figure 2A:
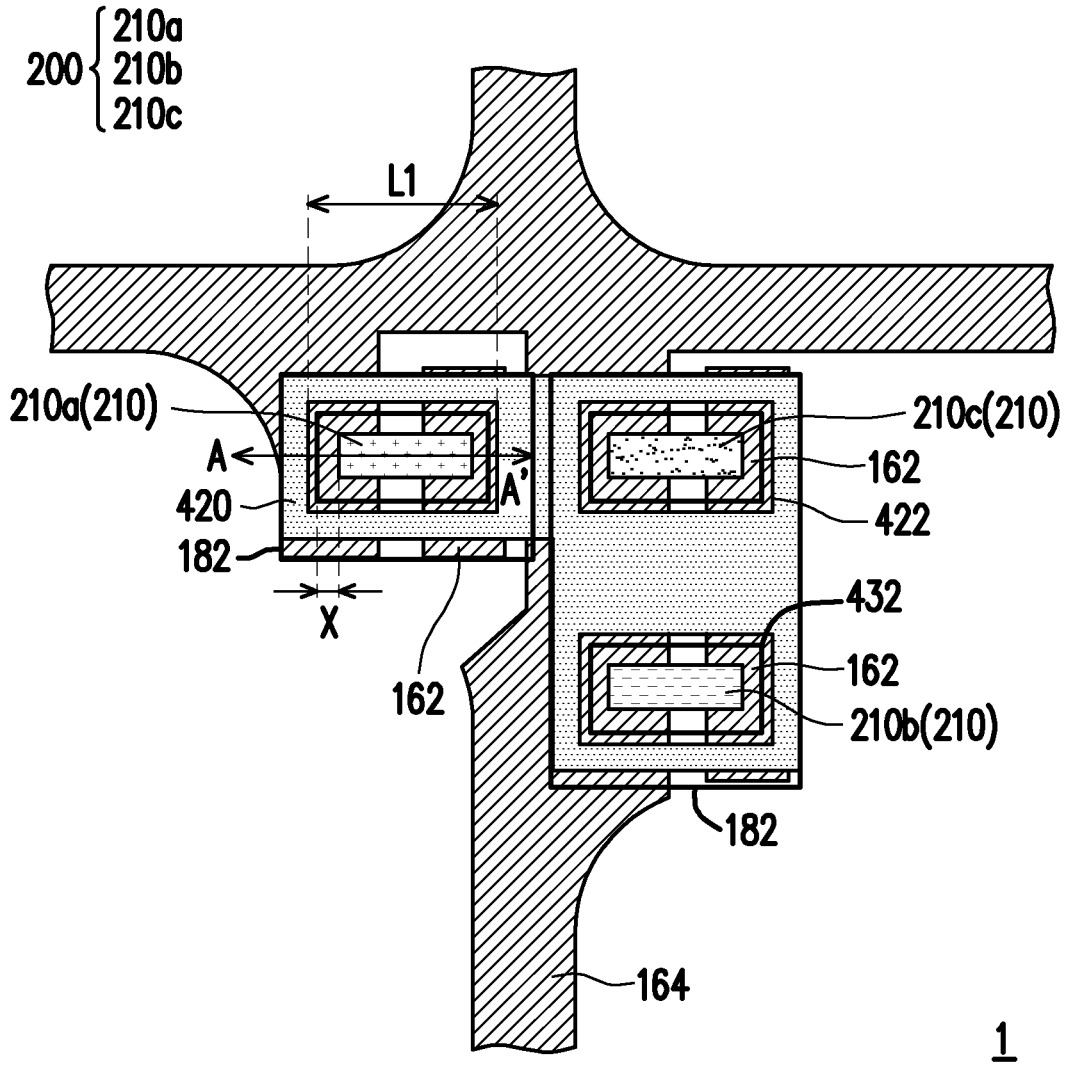
FIG. 2A is a partially enlarged schematic diagram of a transmissive display device according to an embodiment of the present invention.
Figure 2B:
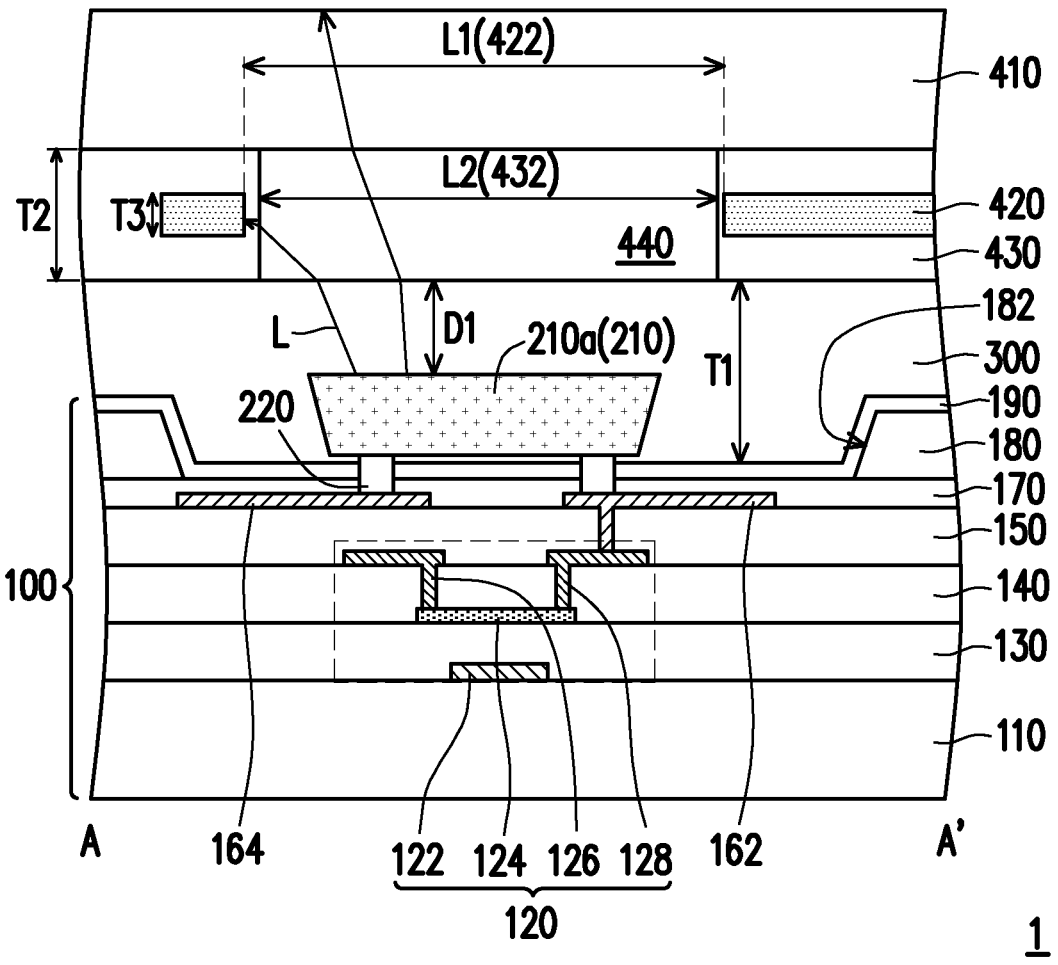
FIG. 2B is a schematic cross-sectional view taken along line A-A' of FIG. 2A.

FIG. 2A is a partially enlarged schematic diagram of a transmissive display device 1 according to an embodiment of the present invention. FIG. 2B is a schematic cross-sectional view taken along line A-A' of FIG. 2A. For example, FIG. 2A corresponds to one of the pixel units 200 in FIG. 1 and its surrounding structures. In addition, FIG. 2A shows a plurality of first electrodes 162 and second electrodes 164 of the circuit substrate 100 connected to the LEDs 210, and other layers in circuit substrate 100 are omitted.

Referring to FIGS. 2A and 2B, the transmissive display device 1 includes a circuit substrate 100, pixel units 200, an encapsulate layer 300, a cover lens 410, a plurality of first light-shielding structures 420, a transparent covering layer 430 and a hole filling portion 440.

The circuit substrate 100 includes a substrate 110, a thin film transistor 120, a first insulating layer 130, a second insulating layer 140, a third insulating layer 150, a first electrode 162, a second electrode 164, a fourth insulating layer 170, a fifth insulating layer 180 and a sixth insulating layer 190.

The substrate 110 is, for example, a rigid substrate, and its material may be glass, quartz, organic polymer or other suitable materials, but the present invention is not limited thereto. In other embodiments, the substrate 110 may also be a flexible substrate or a stretchable substrate. For example, the materials of the flexible substrate and the stretchable substrate include polyimide (PI), polydimethylsiloxane (PDMS), polyethylene terephthalate (PET), polyethylene naphthalate (PEN), polyester (PES), polymethylmethacrylate (PMMA), polycarbonate (PC), polyurethane (PU) or other suitable material.

The thin film transistor 120 is disposed on the substrate 110. The thin film transistor 120 includes a gate electrode 122, a channel 124, a source electrode 126 and a drain electrode 128. The gate electrode 122 is electrically connected to a scan line (not shown). The channel 124 is located above the gate electrode 122, and the first insulating layer 130 is located between the channel 124 and the gate electrode 122. The first insulating layer 130 may also be referred to as a gate insulating layer. The second insulating layer 140 is located on the channel 124 and the first insulating layer 130. The source electrode 126 and the drain electrode 128 are located on the second insulating layer 140 and are electrically connected to the channel 124. The source electrode 126 is electrically connected to the data line (not shown).

In this embodiment, the thin film transistor 120 is a bottom gate type thin film transistor, but the present invention is not limited thereto. According other embodiments, the thin film transistor 120 may also be a top gate type thin film transistor, a dual gate type thin film transistor or other types of thin film transistor.

In some embodiments, the gate electrode 122, the source electrode 126 and the drain electrode 128 has a single-layer structure or a multi-layer structure, which includes metals such as chromium, gold, silver, copper, tin, lead, hafnium, tungsten, molybdenum, neodymium, titanium, tantalum, aluminum, zinc, nickel, alloys of these materials, oxides of these metals, nitrides of these metals or combinations of the above materials or other conductive materials. In some embodiments, the channel 124 has a single-layer structure or a multi-layer structure, which includes amorphous silicon, polysilicon, microcrystalline silicon, single crystal silicon, organic semiconductor material, oxide semiconductor material (for example: indium zinc oxide, indium gallium zinc oxide or other suitable material, or a combination of the above materials) or other suitable material, or a combination of the above materials.

The third insulating layer 150 is located on the second insulating layer 140, the source electrode 126 and the drain electrode 128. The first electrode 162 and the second electrode 164 are located on the third insulating layer 150. The first electrode 162 is electrically connected to the thin film transistor 120. The fourth insulating layer 170 is located on the first electrode 162 and the second electrode 164. The fifth insulating layer 180 is located on the fourth insulating layer 170 and has an opening 182 for accommodating a LED 210. The sixth insulating layer 190 is located on the fifth insulating layer 180 and extends along the sidewalls of the opening 182 to the bottom surface of the opening 182.

The LED 210 is disposed in the opening 182 and is electrically connected to the first electrode 162 and the second electrode 164 through connecting structures 220. In some embodiments, the connecting structures 220 includes gold, nickel, tin, conductive glue, other suitable materials, or a combination of the above materials. Each LED 210 is electrically connected to the thin film transistor 120 through a corresponding first electrode 162, and a plurality of LEDs 210 are electrically connected to the same second electrode 164. The second electrode 164 may also be referred to as a common electrode.

The encapsulate layer 300 is located on the circuit substrate 100 and surrounds the LED 210. In this embodiment, the encapsulate layer 300 covers the top and side surfaces of the LED 210, but the present invention is not limited thereto. In other embodiments, the encapsulate layer 300 does not cover the top surface of LED 210. In some embodiments, the material of the encapsulate layer 300 is, for example, silicone, epoxy, optically clear adhesive (OCA), optical clear resin (OCR), vacuum, air or other materials. In some embodiments, the encapsulate layer 300 has a refractive index of 1 to 1.55. For example, when the encapsulate layer 300 is silicone, epoxy, OCA or OCR, the refractive index is 1.3 to 1.55. When the encapsulate layer 300 is vacuum encapsulated, the refractive index is 1. In some embodiments, the thickness T1 of the encapsulate layer 300 is 10 micrometers to 50 micrometers.

The cover lens 410, the first light-shielding structure 420 and the transparent covering layer 430 are located above the encapsulate layer 300 and overlap the circuit substrate 100. The cover lens 410 is, for example, a rigid substrate, and its material may be glass, quartz, organic polymer, or other suitable materials. However, the present invention is not limited thereto. In other embodiments, the cover lens 410 may also be a flexible substrate or a stretchable substrate. For example, the materials of the flexible substrate and the stretchable substrate include polyimide (PI), polydimethyl-siloxane (PDMS), polyethylene terephthalate (PET), polyethylene naphthalate (PEN), polyester (PES), polymethylmethacrylate (PMMA), polycarbonate (PC), polyurethane (PU) or other suitable material. The refractive index of cover lens 410 is 1.45 to 1.55.

The first light-shielding structure 420 and the transparent covering layer 430 are formed on the cover lens 410. The first light-shielding structure 420 and the transparent covering layer 430 are located between the cover lens 410 and the encapsulate layer 300. The transparent covering layer 430 has a single-layer structure or a multi-layer structure. In this embodiment, the first light-shielding structure 420 is located in the transparent covering layer 430, and a portion of the transparent covering layer 430 is located between the first light-shielding structure 420 and the cover lens 410, but the present invention is not limited thereto. In other embodiments, the first light-shielding structure 420 is formed on the cover lens 410 first, and then the transparent covering layer 430 is formed on the first light-shielding structure 420. In this way, the first light-shielding structure 420 may directly contact the cover lens 410.

Each first light-shielding structure 420 is respectively disposed corresponding to a corresponding one of the pixel units 200, and each first light-shielding structure 420 defines multiple first transparent regions 422. In this embodiment, the first transparent regions 422 are the openings of the first light-shielding structure 420. A plurality of first transparent regions 422 respectively overlap with the LEDs 210 of the corresponding one of the pixel units 200. In this embodiment, each pixel unit 200 has three LEDs 210, and each first light-shielding structure 420 has three first transparent regions 422 respectively corresponding to the aforementioned three LEDs 210. The light emitted by the LEDs 210 may pass through the first transparent regions 422. In the top view, the distance between the edge of the first transparent region 422 and the LED 210 is X. The greater the distance X, the greater the amount of front light emitted by the transmissive display device 1. In some embodiments, the distance X is 5 micrometers to 15 micrometers.

The transparent covering layer 430 surrounds the first light-shielding structure 420. In some embodiments, the transparent covering layer 430 completely covers the sidewalls of the first light-shielding structure 420. The transparent covering layer 430 has a plurality of holes 432, and each hole 432 is located in a corresponding one of the first transparent regions 422. In some embodiments, the length L2 of the hole 432 is less than the length L1 of the first transparent region 422, and the transparent covering layer 430 is partially filled in the first transparent region 422. The depth of the hole 432 (that is, the thickness T2 of the transparent covering layer 430) is greater than the thickness T3 of the first light-shielding structure 420. In some embodiments, the thickness T2 of the transparent covering layer 430 is 3 micrometers to 18 micrometers. In some embodiments, the thickness T3 of the first light-shielding structure 420 is 1 micrometer to 15 micrometers.

The hole filling portion 440 is located in the hole 432 of the transparent covering layer 430. In some embodiments, the hole filling portion 440 fills up the hole 432. In some embodiments, a part of the encapsulates layer 300 is included between the LED 210 and the hole filling portion 440. In some embodiments, the vertical distance D1 between the top surface of the LED 210 and the top surface of the encapsulate layer 300 (or between the top surface of the LED 210 and the hole filling portion 440) is 0 to 40 micrometers.

In some embodiments, the material of the first light-shielding structure 420 includes metal, polymer material (such as cured black photoresist material), or other suitable materials. In some embodiments, the materials of the transparent covering layer 430 includes silicon oxide, silicon nitride, silicon oxynitride or other suitable materials, and the refractive index of the transparent covering layer 430 is 1.44 to 1.55. In some embodiments, the hole filling portion 440 includes vacuum, air or OCR or other suitable materials, and the refractive index of the hole filling portion 440 is 1 to 1.3. In some embodiments, the refractive index of the transparent covering layer 430 is greater than the refractive index of the hole filling portion 440. Therefore, the light L will refract at the interface between the transparent covering layer 430 and the hole filling portion 440, which helps to refract the light L with a large emitting angle to the position of the first light-shielding structure 420, avoiding the problem of backside light leakage caused by the light L with a large emitting angle being reflected by other structures. In some embodiments, the refractive index of the encapsulate layer 300 is greater than the refractive index of the hole filling portion 440. Therefore, the light L will be refracted at the interface between the encapsulate layer 300 and the hole filling portion 440, which helps to refract the light L with a large emitting angle to the position of the first light-shielding structure 420. In some embodiments, the refractive index of the cover lens 410 is greater than the refractive index of the transparent covering layer 430.

Table 1 and Table 2 are the experimental data of the transmissive display device of some comparative examples of the present invention. The structure of the transmissive display device in the comparative examples can be referred to the embodiment in FIG. 2A and FIG. 2B. The difference is that the transparent covering layer of the transmissive display device in the comparative example does not have a hole, and the transmissive display device does not have a hole filling portion within the hole. In the comparative examples in Table 1, the thickness of the encapsulate layer is 30 micrometers. In the comparative examples in Table 2, the thickness of the encapsulate layer is 15 micrometers. In addition, in Table 1 and Table 2, the backside light leakage index represents the total amount of light emitted from the backside divided by the amount of light emitted from the frontside at the front viewing angle.

TABLE 1

| The distance X between the edge of the first transparent region and the LED in the top view | Total amount of light emitted from the frontside (lm) | Light output at front viewing angle (cd) | backside light leakage index |
|---|---|---|---|
| Without first light-shielding structure | 0.145 | 3.398E−2 | 0.2996 |
| X = 15 μm | 0.122 | 3.393E−2 | 0.2265 |
| X = 10 μm | 0.101 | 3.389E−2 | 0.1815 |
| X = 5 μm | 7.513E−2 | 3.378E−2 | 0.1353 |

TABLE 2

| The distance X between the edge of the first transparent region and the LED in the top view | Total amount of light emitted from the frontside (lm) | Light output at front viewing angle (cd) | backside light leakage index |
|---|---|---|---|
| Without first light-shielding structure | 0.147 | 3.433E−2 | 0.3038 |
| X = 15 μm | 0.145 | 3.429E−2 | 0.2948 |

TABLE 2-continued

| The distance X between the edge of the first transparent region and the LED in the top view | Total amount of light emitted from the frontside (lm) | Light output at front viewing angle (cd) | backside light leakage index |
|---|---|---|---|
| X = 10 μm | 0.136 | 3.427E−2 | 0.2633 |
| X = 5 μm | 0.115 | 3.425E−2 | 0.2105 |

Table 3 and Table 4 are the experimental data of transmissive display device of some embodiments of the present invention. The structure of the transmissive display device can be referred to the embodiment in FIGS. 2A and 2B. In the embodiment of Table 3, the thickness of the encapsulate layer is 30 micrometers. In the embodiment of Table 4, the thickness of the encapsulate layer is 15 micrometers.

TABLE 3

| The distance X between the edge of the first transparent region and the LED in the top view | Total amount of light emitted from the frontside (lm) | Light output at front viewing angle (cd) | backside light leakage index |
|---|---|---|---|
| Without first light-shielding structure | 0.145 | 3.398E−2 | 0.2996 |
| X = 15 μm | 8.872E−2 | 3.22E−2 | 0.182 |
| X = 10 μm | 7.151E−2 | 3.214E−2 | 0.1326 |
| X = 5 μm | 5.293E−2 | 3.16E−2 | 0.0988 |

TABLE 4

| The distance X between the edge of the first transparent region and the LED in the top view | Total amount of light emitted from the frontside (lm) | Light output at front viewing angle (cd) | backside light leakage index |
|---|---|---|---|
| Without first light-shielding structure | 0.147 | 3.433E−2 | 0.3038 |
| X = 15 μm | 0.115 | 3.272E−2 | 0.1991 |
| X = 10 μm | 9.989E−2 | 3.267E−2 | 0.1531 |
| X = 5 μm | 7.959E−2 | 3.245E−2 | 0.1077 |

Combining Tables 1 to 4, it can be seen that when the transmissive display device includes the first light-shielding structure 420, the transparent covering layer 430 with the hole 432, and the hole filling portion 440 located within the hole 432, the backside light leakage index can be significantly reduced, and the impact on the light output at the front viewing angle is not significant. In other words, the problem of backside light leakage can be improved through the first light shielding structure 420, the transparent covering layer 430 with the hole 432, and the hole filling portion 440 located in the hole 432. In addition, when the distance X between the edge of the first transparent region 422 and the LED 210 in the top view is smaller, the backside light leakage index will be smaller. The optimal distance X is less than or equal to 5 micrometers.

Figure 3:
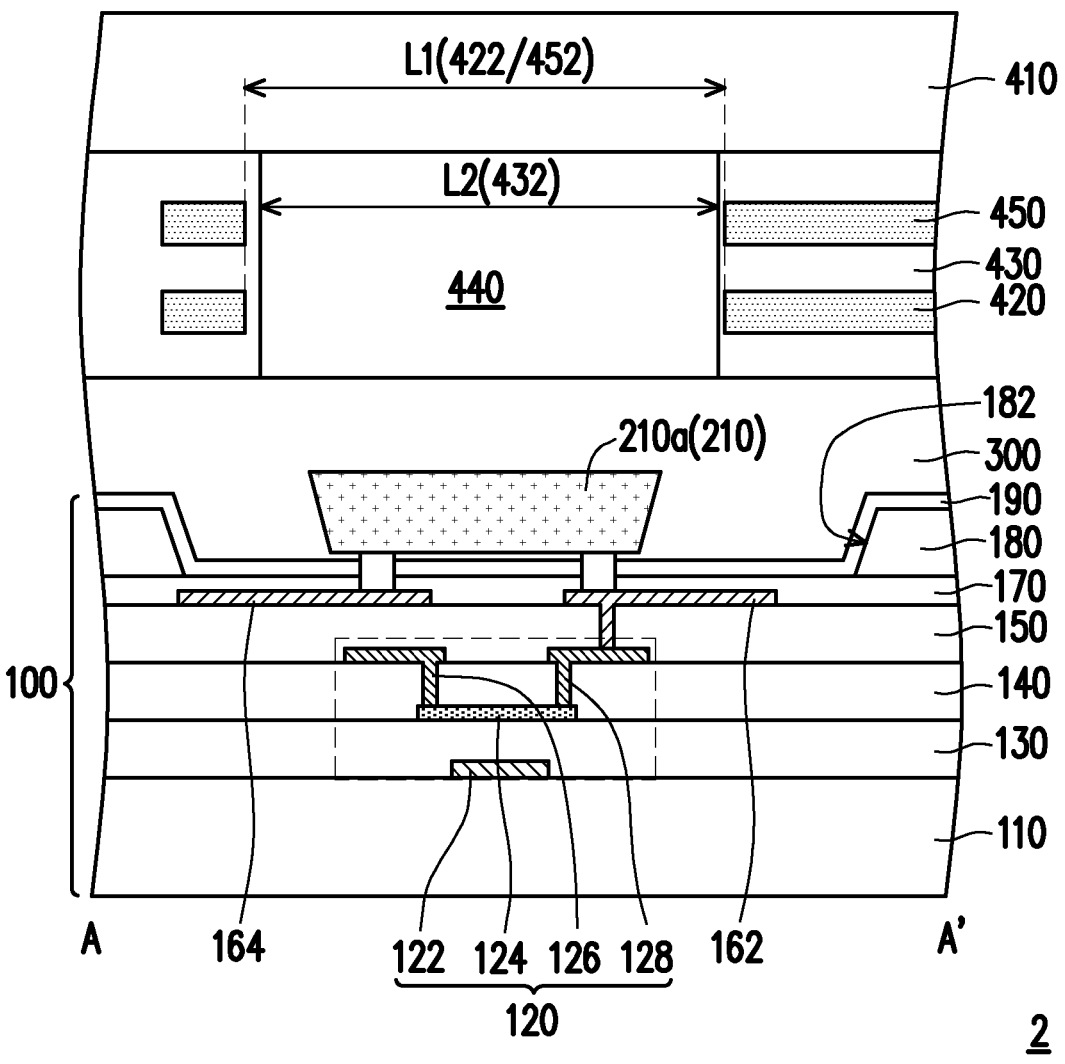
FIG. 3 is a schematic cross-sectional view of a transmissive display device according to an embodiment of the present invention.

FIG. 3 is a schematic cross-sectional view of a transmissive display device 2 according to an embodiment of the present invention. It should be noted herein that, in embodiments provided in FIG. 3, element numerals and partial content of the embodiments provided in FIG. 2A and FIG. 2B are followed, the same or similar reference numerals being used to represent the same or similar elements, and description of the same technical content being omitted. For a description of an omitted part, reference may be made to the foregoing embodiment, and the descriptions thereof are omitted herein.

The main difference between the transmissive display device 2 in FIG. 3 and the transmissive display device 1 in FIG. 2B is that the transmissive display device 2 further comprises a plurality of second light-shielding structures 450. The second light-shielding structures 450 are located between the first light-shielding structures 420 and the cover lens 410. The second light-shielding structures 450 have a similar shape to the first light-shielding structures 420. The shape of the second light-shielding structure 450 can refer to the shape of the first light-shielding structure 420 in FIG. 2A.

Referring to FIG. 3, each second light-shielding structure 450 overlaps with a corresponding one of the first light-shielding structures 420, and each second light-shielding structure 450 has a plurality of second transparent regions 452 (only one of the second transparent regions 452 is shown is FIG. 3). The second transparent regions 452 are overlapping with the first transparent regions 422, respectively. Each hole 432 of the transparent covering layer 430 is located in a corresponding one of the second transparent region 452 and a corresponding one of the first transparent region 422, respectively.

Table 5 and table 6 are experimental data of transmissive display devices of some comparative examples of the present invention. The structure of the transmissive display device in the comparative example can refer to the embodiment in FIG. 3. The difference is that the transparent covering layer of the transmissive display device in the comparative examples does not have a hole, and the transmissive display device does not have a hole filling portion within the hole. In the comparative example in Table 5, the thickness of the encapsulate layer is 30 micrometers. In the comparative example in Table 6, the thickness of the encapsulate layer is 15 micrometers. In addition, in Table 1 and Table 2, the backside light leakage index represents the total amount of light emitted from the backside divided by the amount of light emitted from the frontside at the front viewing angle.

TABLE 5

| The distance X between the edge of the first/second transparent region and the LED in the top view | Total amount of light emitted from the frontside (lm) | Light output at front viewing angle (cd) | backside light leakage index |
|---|---|---|---|
| X = 5 μm | 6.452E−2 | 3.371E−2 | 0.1131 |

TABLE 6

| The distance X between the edge of the first/second transparent region and the LED in the top view | Total amount of light emitted from the frontside (lm) | Light output at front viewing angle (cd) | backside light leakage index |
|---|---|---|---|
| X = 5 μm | 0.102 | 3.421E−2 | 0.1764 |

Table 7 and Table 8 are the experimental data of transmissive display device of some embodiments of the present invention. The structure of the transmissive display device can refer to the embodiment in FIG. 3. In the embodiment of Table 7, the thickness of the encapsulate layer is 30 micrometers. In the embodiment of Table 8, the thickness of the encapsulate layer is 15 micrometers.

TABLE 7

| The distance X between the edge of the first/second transparent region and the LED in the top view | Total amount of light emitted from the frontside (lm) | Light output at front viewing angle (cd) | backside light leakage index |
|---|---|---|---|
| Without first light-shielding structure and second light-shielding structure | 0.145 | 3.398E−2 | 0.2996 |
| X = 15 μm | 7.205E−2 | 3.213E−2 | 0.143 |
| X = 10 μm | 5.592E−2 | 3.209E−2 | 0.1045 |
| X = 5 μm | 4.013E−2 | 3.111E−2 | 0.08 |

TABLE 8

| The distance X between the edge of the first/second transparent region and the LED in the top view | Total amount of light emitted from the frontside (lm) | Light output at front viewing angle (cd) | backside light leakage index |
|---|---|---|---|
| Without first light-shielding structure and second light-shielding structure | 0.147 | 3.433E−2 | 0.3038 |
| X = 15 μm | 9.696E−2 | 3.264E−2 | 0.1468 |
| X = 10 μm | 8.086E−2 | 3.256E−2 | 0.1071 |
| X = 5 μm | 5.916E−2 | 3.231E−2 | 0.0696 |

Combining Tables 5 to 8, it can be seen that when the transmissive display device includes the first light-shielding structure 420, the second light-shielding structure 450, the transparent covering layer 430 with the hole 432, and the hole filling portion 440 located within the hole 432, the backside light leakage index can be significantly reduced, and the impact on the light output at the front viewing angle is not significant. In other words, the problem of backside light leakage can be improved through the first light-shielding structure 420, the second light-shielding structure 450, the transparent covering layer 430 with the hole 432, and the hole filling portion 440 located in the hole 432.

Figure 4:
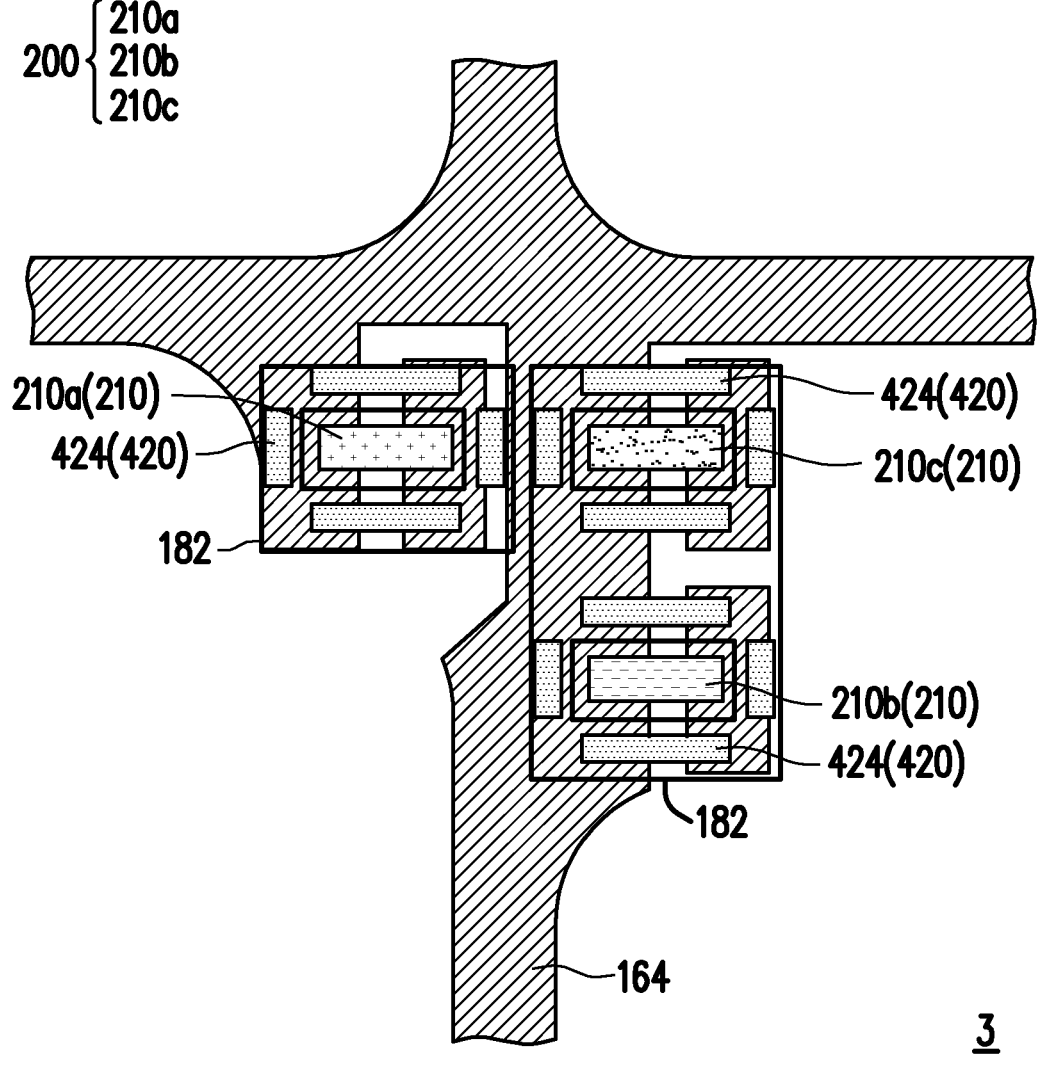
FIG. 4 is a partially enlarged schematic diagram of a transmissive display device according to an embodiment of the present invention.

FIG. 4 is a partially enlarged schematic diagram of a transmissive display device 3 according to an embodiment of the present invention. It should be noted herein that, in embodiments provided in FIG. 4, element numerals and partial content of the embodiments provided in FIG. 2A and FIG. 2B are followed, the same or similar reference numerals being used to represent the same or similar elements, and description of the same technical content being omitted. For a description of an omitted part, reference may be made to the foregoing embodiment, and the descriptions thereof are omitted herein.

The main difference between the transmissive display device 3 of FIG. 4 and the transmissive display device 1 of FIG. 2B is that each first light-shielding structure 420 of the transmissive display device 3 includes a plurality of first light-shielding segments 424.

Referring to FIG. 4, the first light-shielding segments 424 are separated from each other and surround the first transparent regions 422. In this embodiment, each first light-shielding segment 424 is straight line shaped, but the present invention is not limited thereto. In other embodiments, the first light-shielding segment 424 may be L-shaped or other shapes.

Figure 5:
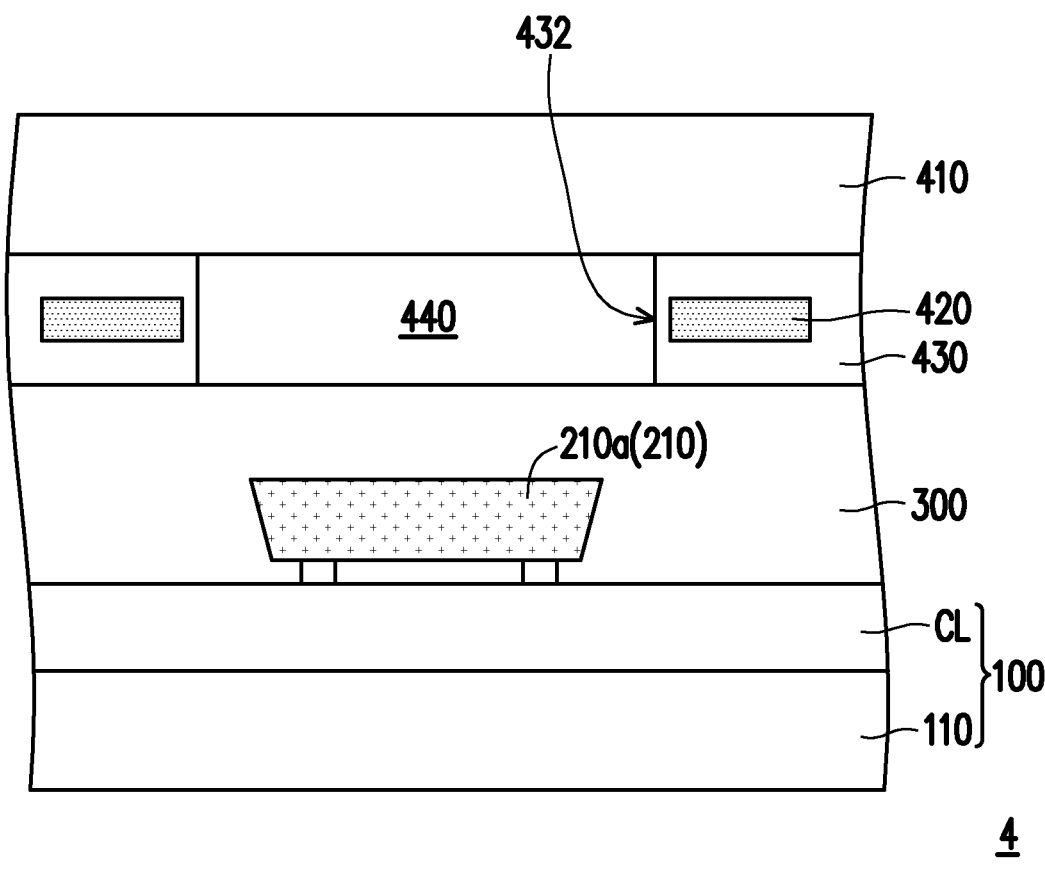
FIG. 5 is a schematic cross-sectional view of a transmissive display device according to an embodiment of the present invention.

FIG. 5 is a schematic cross-sectional view of a transmissive display device 4 according to an embodiment of the present invention. It should be noted herein that, in embodiments provided in FIG. 5, element numerals and partial content of the embodiments provided in FIG. 2A and FIG.

2B are followed, the same or similar reference numerals being used to represent the same or similar elements, and description of the same technical content being omitted. For a description of an omitted part, reference may be made to the foregoing embodiment, and the descriptions thereof are omitted herein.

The main difference between the transmissive display device 4 in FIG. 5 and the transmissive display device 1 in FIG. 2B is that: the circuit substrate 100 of the transmissive display device 4 includes a substrate 110 and a circuit layer CL, wherein the circuit layer CL may include a thin film transistor, a plurality of insulating layers and a plurality of conductive layers. The specific structure in circuit layer CL can be adjusted according to actual needs.

Figures 6A, 6B:
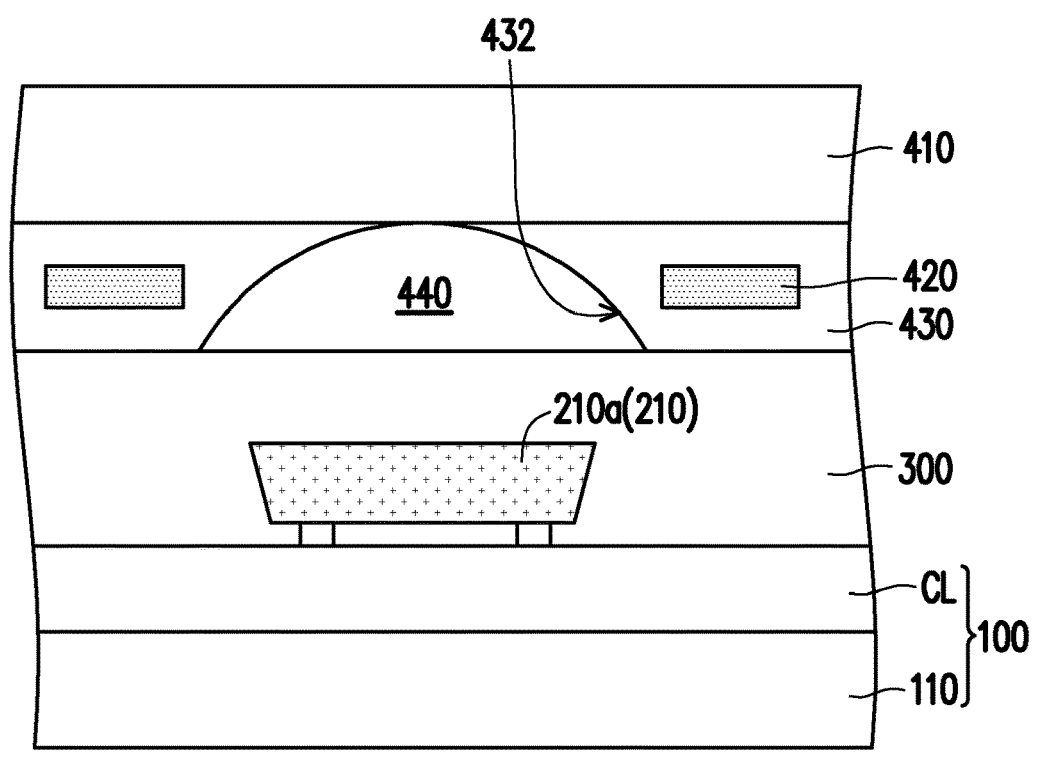
FIGS. 6A to 6D are schematic cross-sectional views of transmissive display devices according to some embodiments of the present invention.
Figure 6C:
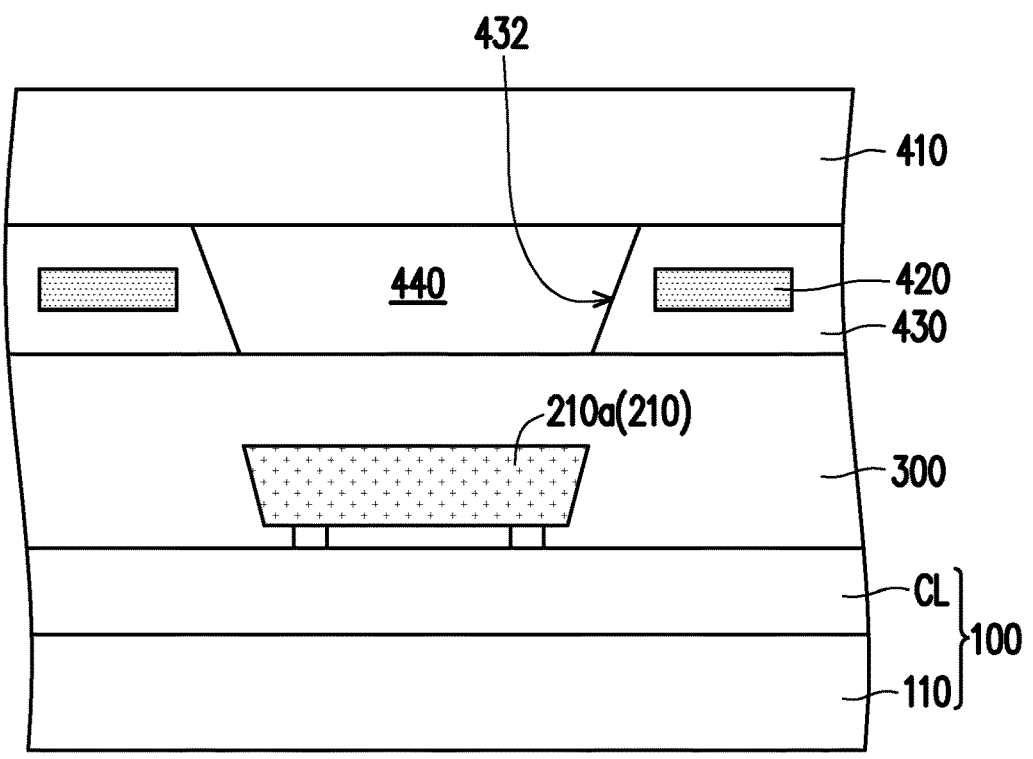

In this embodiment, the cross-sectional profile of the hole 432 in the transparent covering layer 430 is rectangular, and the backside light leakage index is 0.0988, but the present invention is not limited thereto. In other embodiments, the cross-sectional profile of the hole 432 is semi-elliptical (as shown in FIG. 6A), and the backside light leakage index is 0.1837. In other embodiments, the cross-sectional profile of the hole 432 is a trapezoid that is narrower at the top and wider at the bottom (as shown in FIG. 6B), and the backside light leakage index is 0.093. In other embodiments, the cross-sectional profile of the hole 432 is a trapezoid that is wider at the top and narrower at the bottom (as shown in FIG. 6C), and the backside light leakage index is 0.1022.

Figure 6D:
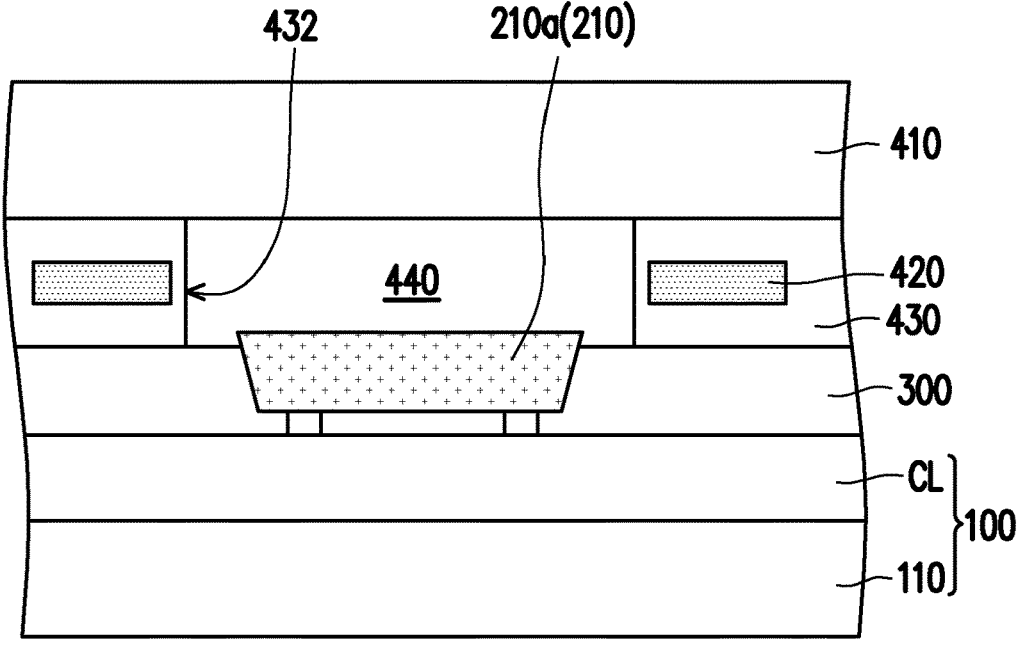

In addition, in the embodiment of FIG. 5, the encapsulate layer 300 covers the top surface of the LED 210, but the present invention is not limited thereto. In other embodiments, the encapsulate layer 300 does not cover the top surface of the LED 210, and a portion of the LED 210 is extending into the hole 432 (as shown in FIG. 6D), and the backside light leakage index is 0.1466.

Figure 7:
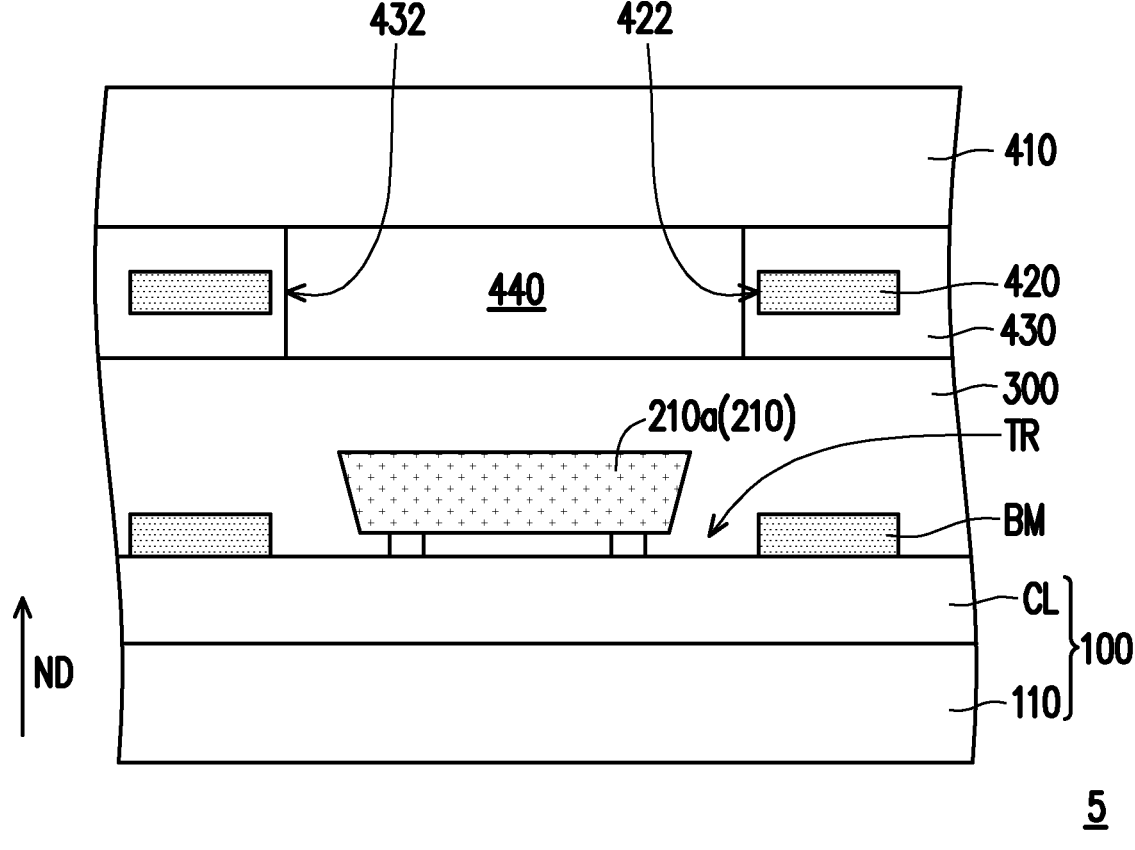
FIG. 7 is a schematic cross-sectional view of a transmissive display device according to an embodiment of the present invention.

FIG. 7 is a schematic cross-sectional view of a transmissive display device 5 according to an embodiment of the present invention. It should be noted herein that, in embodiments provided in FIG. 7, element numerals and partial content of the embodiments provided in FIG. 5 are followed, the same or similar reference numerals being used to represent the same or similar elements, and description of the same technical content being omitted. For a description of an omitted part, reference may be made to the foregoing embodiment, and the descriptions thereof are omitted herein.

The main difference between the transmissive display device 5 in FIG. 7 and the transmissive display device 4 in FIG. 5 is that the transmissive display device 5 further includes a plurality of black matrix structure BM. For the sake of clarity, FIG. 7 only shows a part of the black matrix structure BM. The black matrix structure BM has a shape similar to that of the first light-shielding structure 420, and the shape of the black matrix structure BM can refer to the shape of the first light-shielding structure 420 in FIG. 2A or FIG. 4."

The black matrix structure BM is located between the encapsulate layer 300 and the circuit substrate 100. Each black matrix structure BM is overlapping with a corresponding one of the first light-shielding structures 420, and each black matrix structure BM has a plurality of transmissive regions TR (only one transmissive region TR is shown in FIG. 7). Each transmissive region TR is overlapping with a corresponding one first transparent region 422. By setting up the black matrix structure BM, the backside light leakage index can be effectively reduced, for example, from 0.0988 of the transmissive display device 4 in FIG. 5 to 0.0886 of the transmissive display device 5 in FIG. 7.

In this embodiment, the black matrix structure BM and the first light-shielding structure 420 completely overlap in the normal direction ND of the surface of the substrate 110, but the present invention is not limited thereto.

Figure 8:
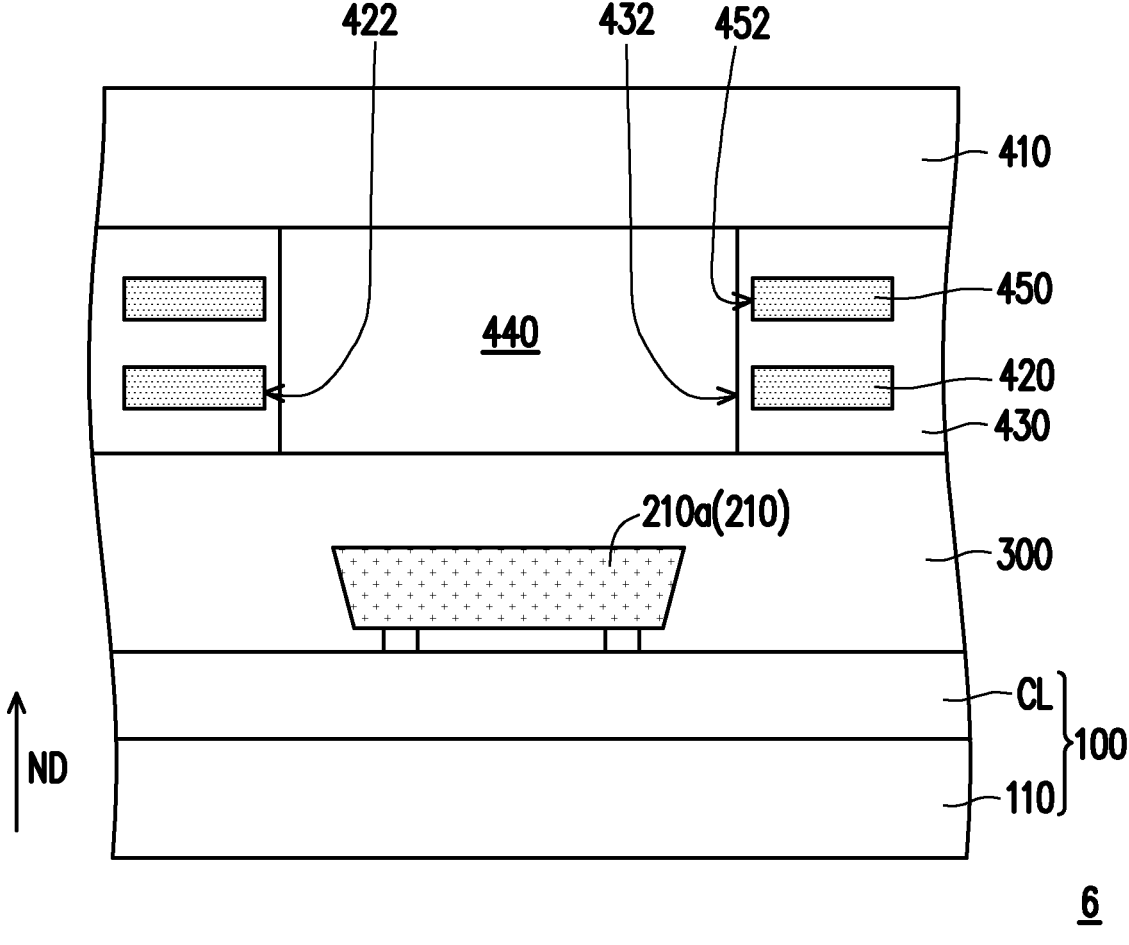
FIG. 8 is a schematic cross-sectional view of a transmissive display device according to an embodiment of the present invention.

FIG. 8 is a schematic cross-sectional view of a transmissive display device 6 according to an embodiment of the present invention. It should be noted herein that, in embodiments provided in FIG. 8, element numerals and partial content of the embodiments provided in FIG. 5 are followed, the same or similar reference numerals being used to represent the same or similar elements, and description of the same technical content being omitted. For a description of an omitted part, reference may be made to the foregoing embodiment, and the descriptions thereof are omitted herein.

The main difference between the transmissive display device 6 in FIG. 8 and the transmissive display device 4 in FIG. 5 is that the transmissive display device 6 further includes a plurality of second light-shielding structures 450. The second light-shielding structures 450 are located between the first light-shielding structures 420 and the cover lens 410. The second light-shielding structures 450 have a similar shape to the first light-shielding structures 420. The shape of the second light-shielding structure 450 can refer to the shape of the first light-shielding structure 420 in FIG. 2A or FIG. 4.

Referring to FIG. 8, each second light-shielding structure 450 is overlapping with a corresponding one of the first light-shielding structures 420, and each second light-shielding structure 450 has a plurality of second transparent regions 452 (only one second transparent region 452 is shown in FIG. 8). The second transparent regions 452 are overlapping with the first transparent regions 422 respectively. Each hole 432 of the transparent covering layer 430 is located in a corresponding one of the second transparent regions 452 and a corresponding one of the first transparent regions 422 respectively.

Figure 9A:
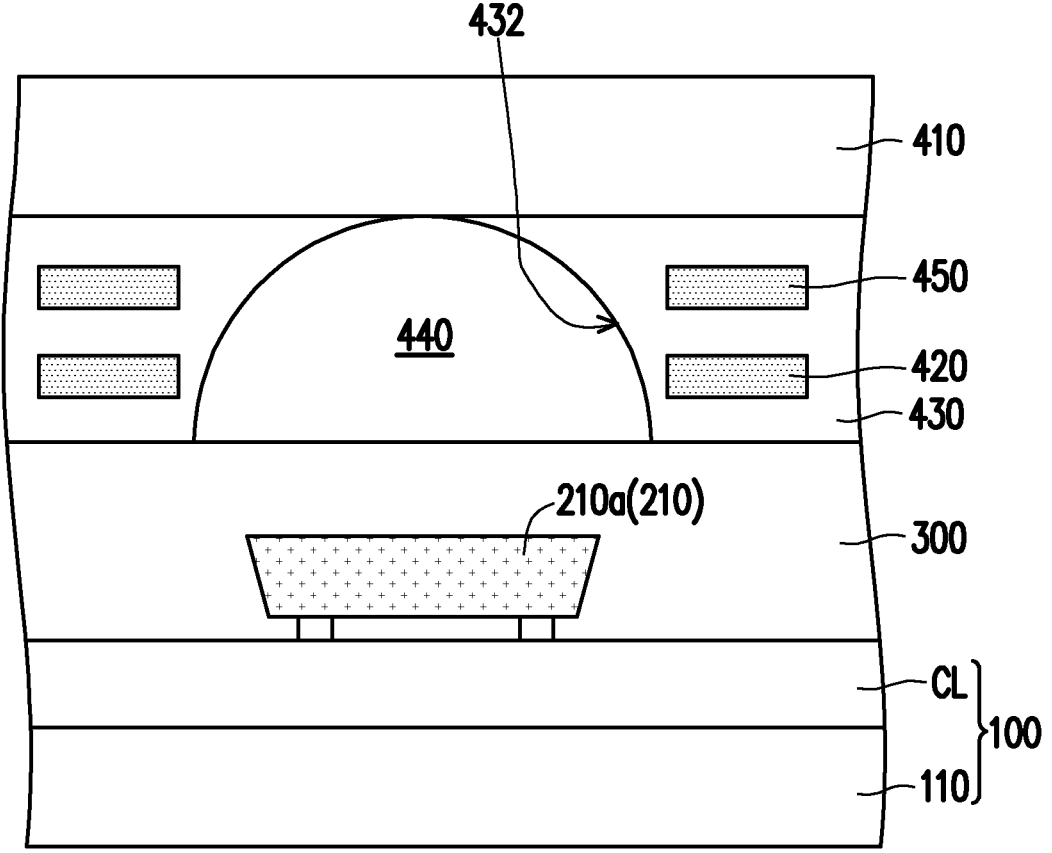
FIGS. 9A to 9D are schematic cross-sectional views of transmissive display devices according to some embodiments of the present invention.
Figure 9B:
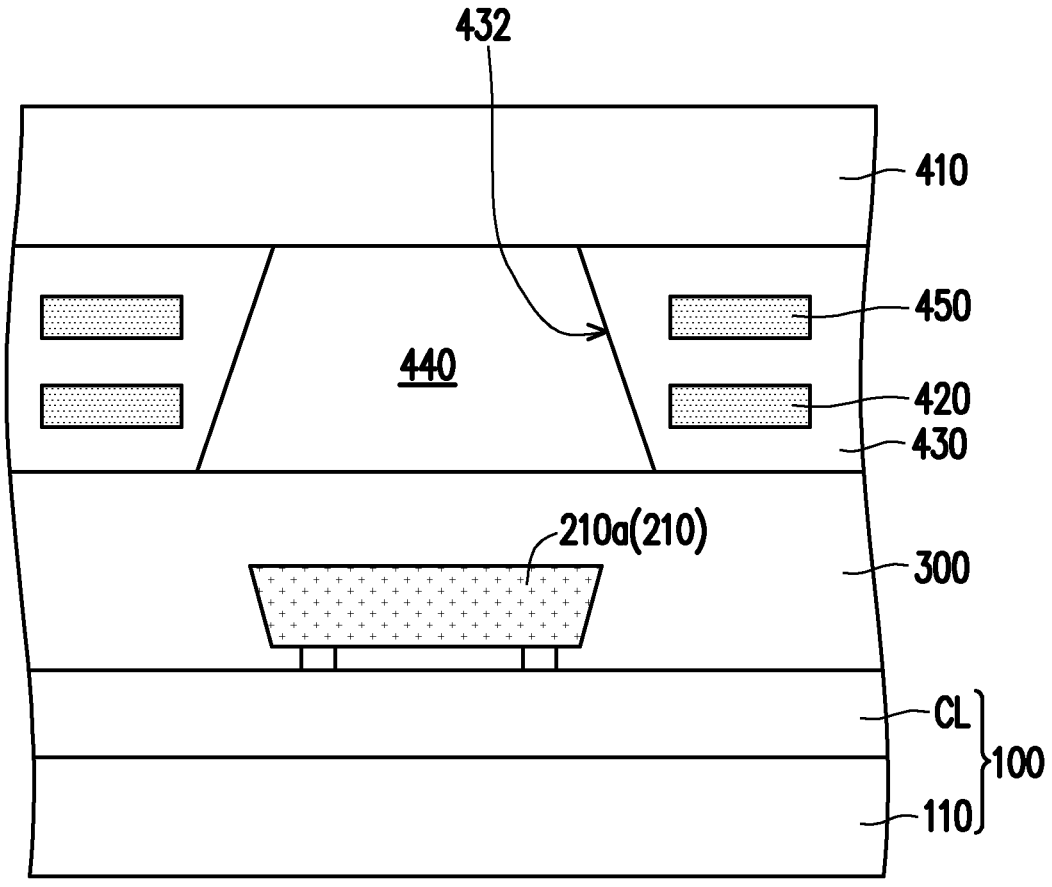
Figure 9C:
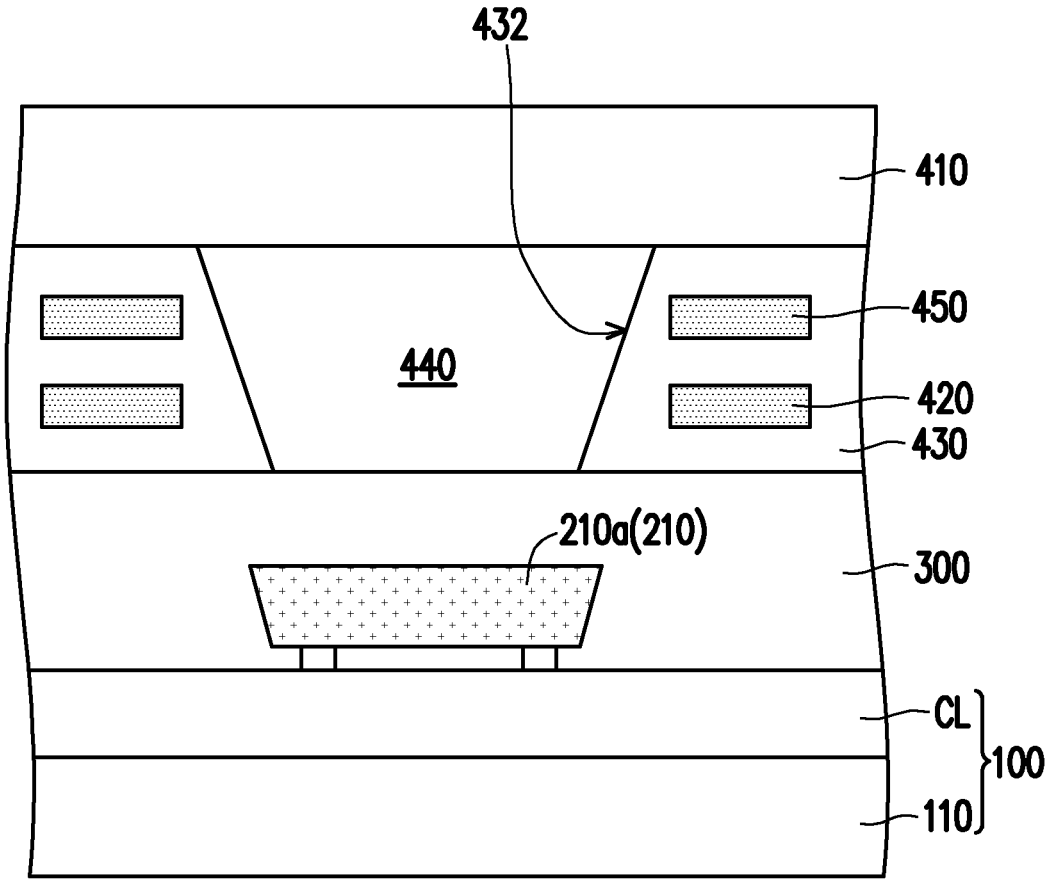

In this embodiment, the cross-sectional profile of the hole 432 in the transparent covering layer 430 is rectangular, and the backside light leakage index is 0.0696, but the present invention is not limited thereto. In other embodiments, the cross-sectional profile of the hole 432 is semi-elliptical (as shown in FIG. 9A), and the backside light leakage index is 0.1676. In other embodiments, the cross-sectional profile of the hole 432 is a trapezoid that is narrower at the top and wider at the bottom (as shown in FIG. 9B), and the backside light leakage index is 0.0778. In other embodiments, the cross-sectional profile of the hole 432 is a trapezoid that is wider at the top and narrower at the bottom (as shown in FIG. 9C), and the backside light leakage index is 0.0780.

Figure 9D:
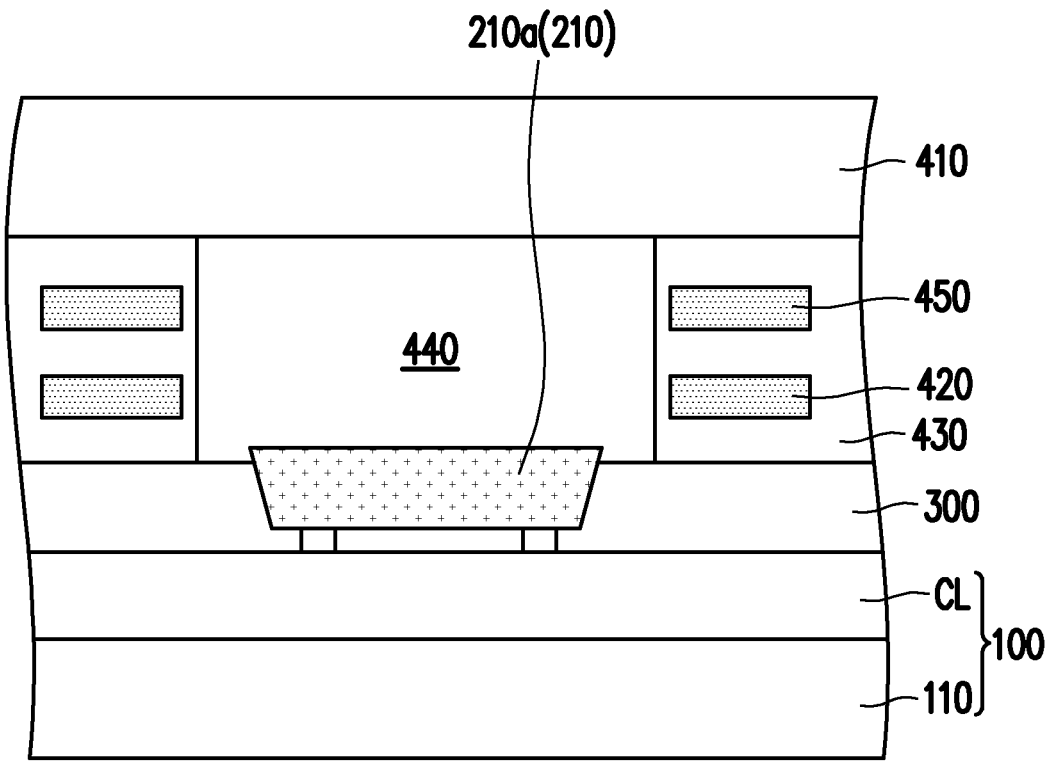

In addition, in the embodiment of FIG. 8, the encapsulate layer 300 covers the top surface of the LED 210, but the present invention is not limited thereto. In other embodiments, the encapsulate layer 300 does not cover the top surface of the LED 210, and a portion of the LED 210 is extending into the hole 432 (as shown in FIG. 9D), and the backside light leakage index is 0.0928.

Figure 10:
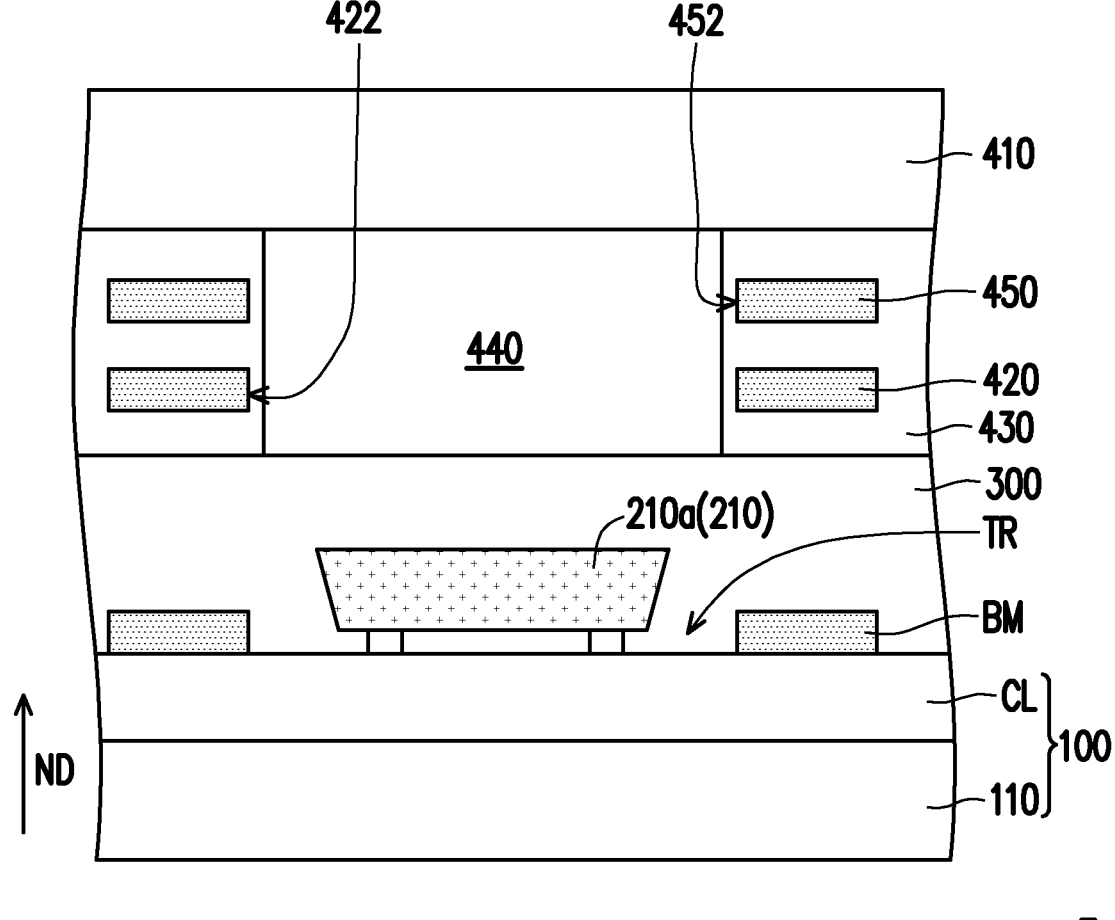
FIG. 10 is a schematic cross-sectional view of a transmissive display device according to an embodiment of the present invention.

FIG. 10 is a schematic cross-sectional view of a transmissive display device 7 according to an embodiment of the present invention. It should be noted herein that, in embodiments provided in FIG. 10, element numerals and partial content of the embodiments provided in FIG. 8 are followed, the same or similar reference numerals being used to represent the same or similar elements, and description of the same technical content being omitted. For a description of an omitted part, reference may be made to the foregoing embodiment, and the descriptions thereof are omitted herein.

The main difference between the transmissive display device 7 in FIG. 10 and the transmissive display device 6 in FIG. 8 is that the transmissive display device 7 further includes a plurality of black matrix structure BM. For the sake of clarity, FIG. 10 only shows a part of the black matrix structure BM. The black matrix structure BM has a shape similar to that of the first light-shielding structure 420, and the shape of the black matrix structure BM can refer to the shape of the first light-shielding structure 420 in FIG. 2A or FIG. 4."

The black matrix structure BM is located between the encapsulate layer 300 and the circuit substrate 100. Each black matrix structure BM is overlapping with a corresponding one of the first light-shielding structures 420, and each black matrix structure BM has a plurality of transmissive regions TR (only one transmissive region TR is shown in FIG. 10). Each transmissive region TR is overlapping with a corresponding one first transparent region 422. By setting up the black matrix structure BM, the backside light leakage index can be effectively reduced, for example, from 0.0696 of the transmissive display device 6 in FIG. 8 to 0.0647 of the transmissive display device 7 in FIG. 10.

Figure 11:
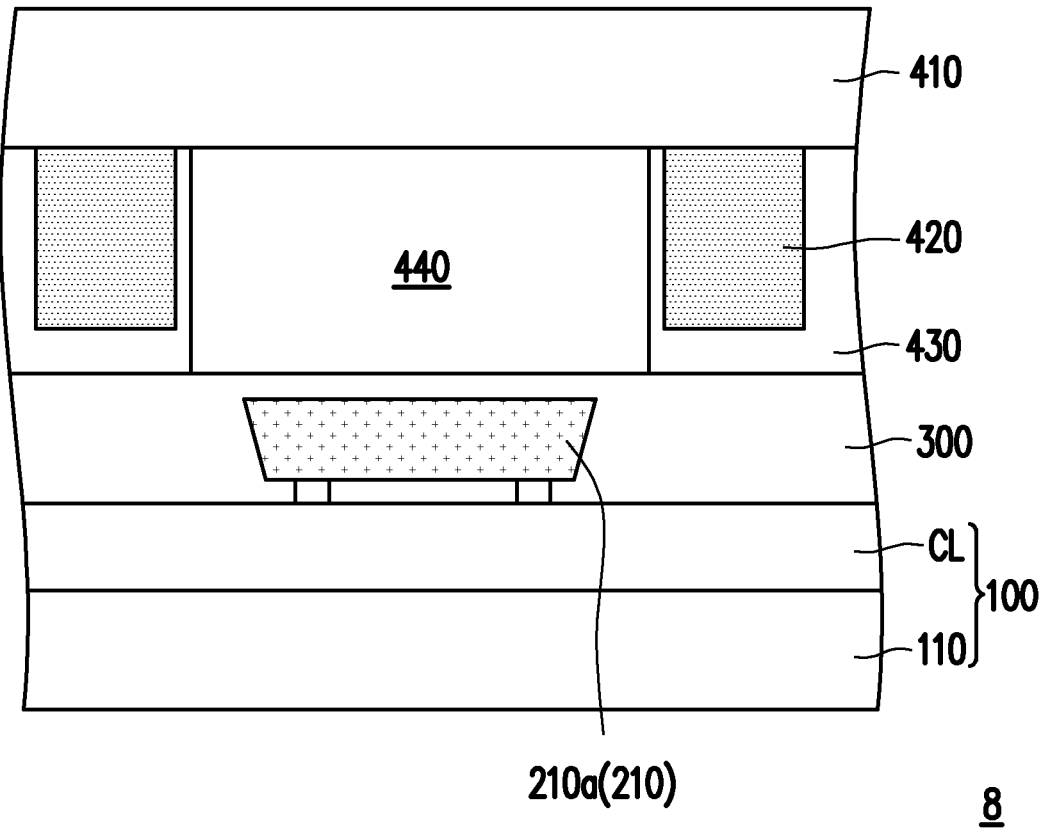
FIG. 11 is a schematic cross-sectional view of a transmissive display device according to an embodiment of the present invention.

FIG. 11 is a schematic cross-sectional view of a transmissive display device 8 according to an embodiment of the present invention. It should be noted herein that, in embodiments provided in FIG. 11, element numerals and partial content of the embodiments provided in FIG. 5 are followed, the same or similar reference numerals being used to represent the same or similar elements, and description of the same technical content being omitted. For a description of an omitted part, reference may be made to the foregoing embodiment, and the descriptions thereof are omitted herein.

The main difference between the transmissive display device 8 in FIG. 11 and the transmissive display device 4 in FIG. 5 is that the thickness of the first light-shielding structure 420 of the transmissive display device 8 in FIG. 11 is thicker, and the first light-shielding structure 420 in FIG. 11 is in contact with the cover lens 410.

Figure 12:
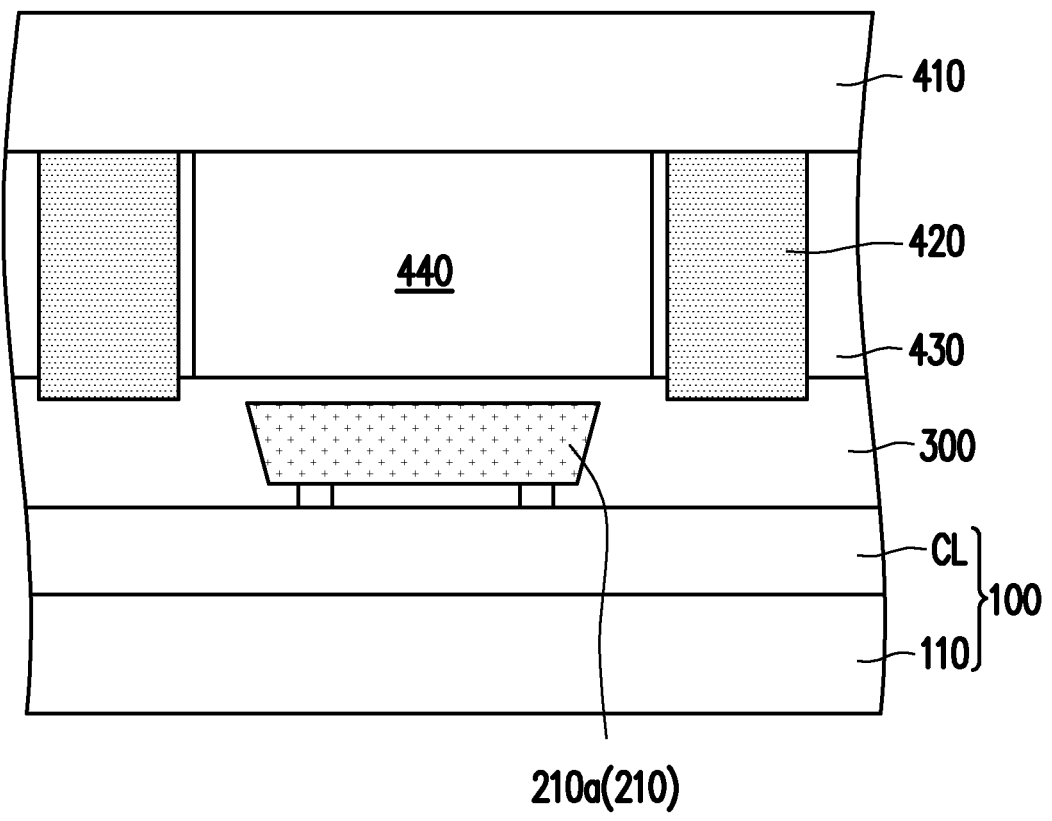
FIG. 12 is a schematic cross-sectional view of a transmissive display device according to an embodiment of the present invention.

Referring to FIG. 11, when using polymer materials (such as cured black photoresist material) to make the first light-shielding structure 420, it is easier to make a thicker first light-shielding structure 420. For example, the thickness of the first light-shielding structure 420 can be 5 micrometers to 15 micrometers. In this embodiment, the first light-shielding structure 420 is not in contact with the encapsulation layer 300, but the invention is not limited thereto. In other embodiments, part of the first light-shielding structure 420 extends into the encapsulation layer 300, as shown in FIG. 12.

Figure 13A:
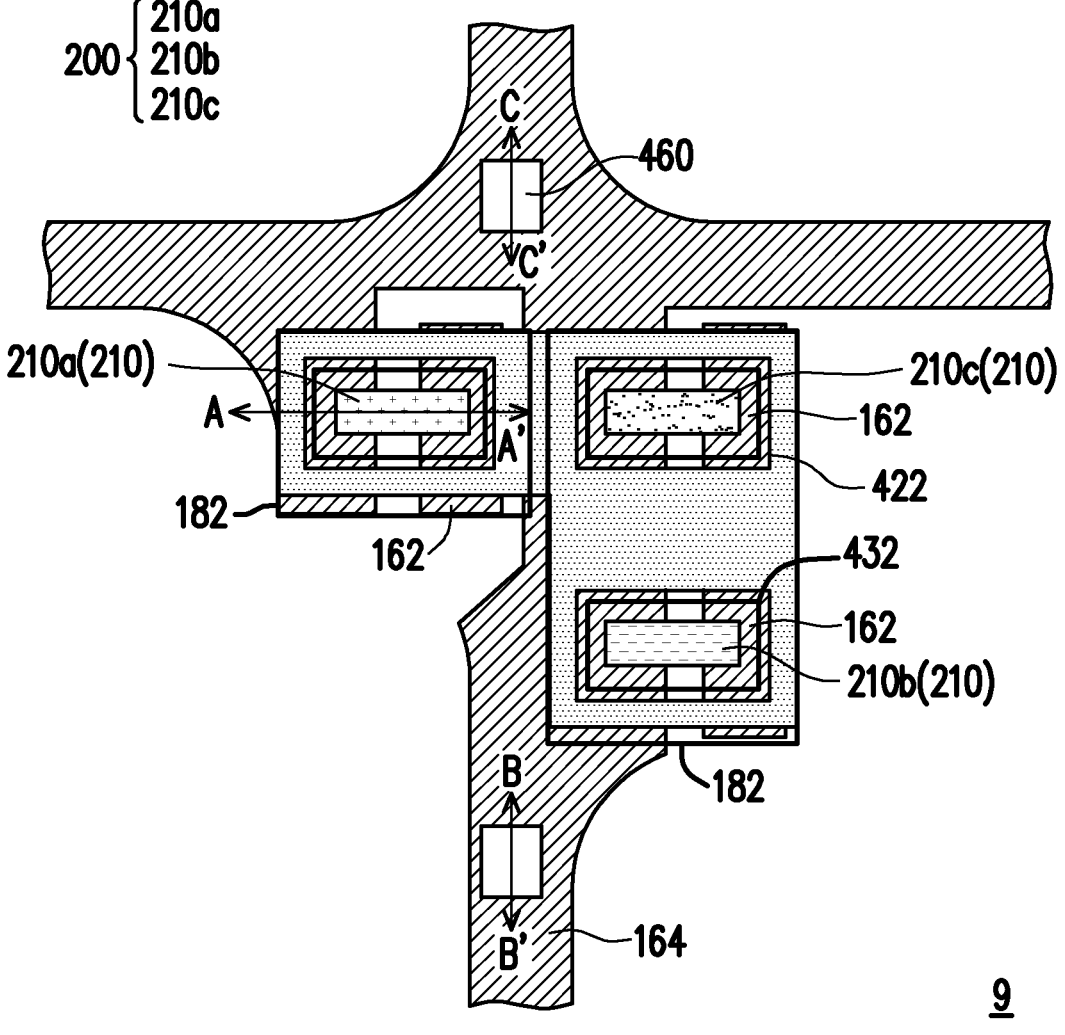
FIG. 13A is a partially enlarged schematic diagram of a transmissive display device according to an embodiment of the present invention.
Figure 13B:
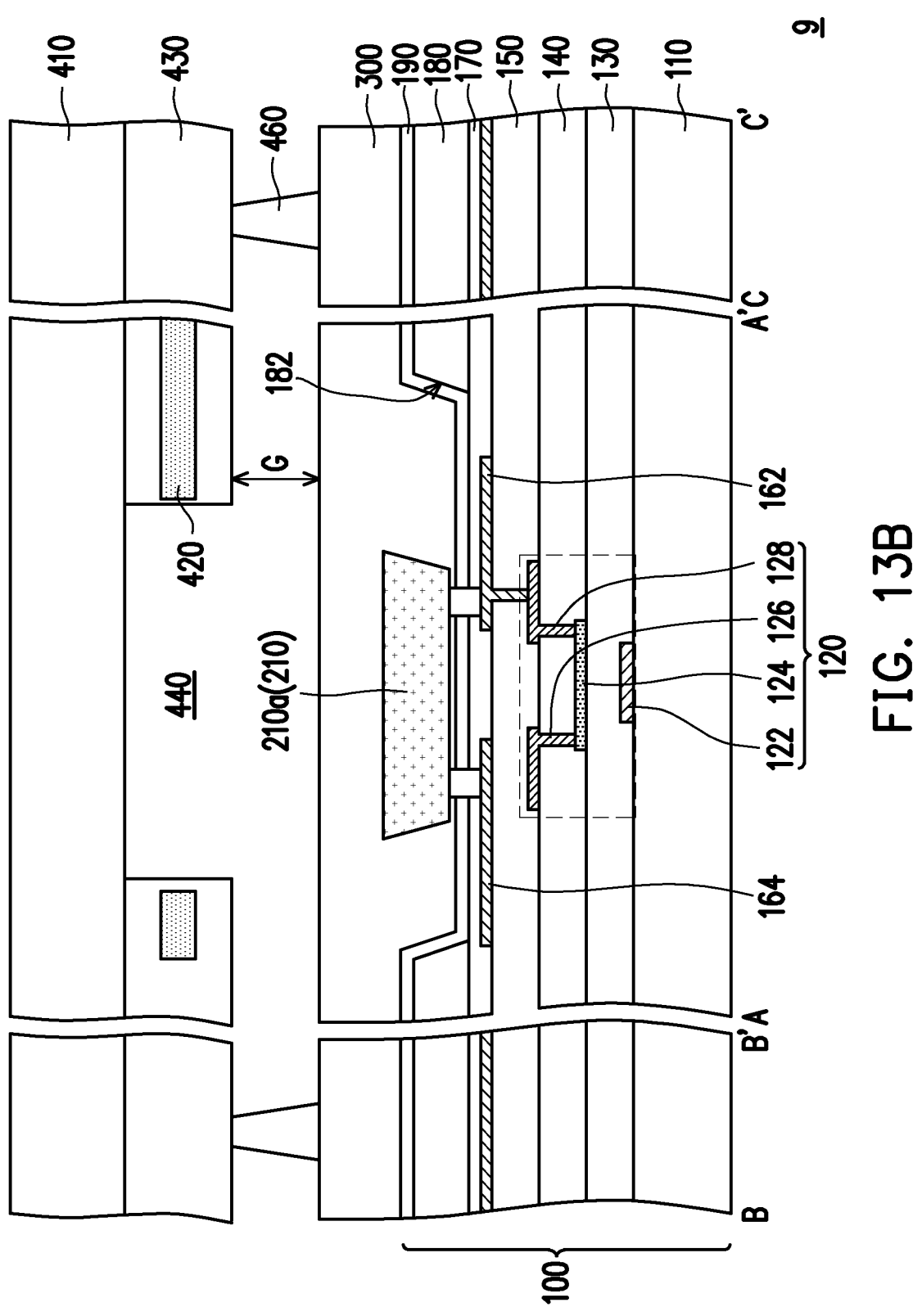
FIG. 13B is a schematic cross-sectional view taken along lines A-A', B-B' and C-C' of FIG. 13A.

FIG. 13A is a partially enlarged schematic diagram of a transmissive display device 9 according to an embodiment of the present invention. FIG. 13B is a schematic cross-sectional view taken along lines A-A', B-B' and C-C' of FIG. 13A. It should be noted herein that, in embodiments provided in FIGS. 13A and 13B, element numerals and partial content of the embodiments provided in FIGS. 2A and 2B are followed, the same or similar reference numerals being used to represent the same or similar elements, and description of the same technical content being omitted. For a description of an omitted part, reference may be made to the foregoing embodiment, and the descriptions thereof are omitted herein.

The main difference between the transmissive display device 9 of FIGS. 13A and 13B and the transmissive display device 1 of FIGS. 2A and 2B is that there is a gap between the transparent covering layer 430 and the encapsulate layer 300 of the transmissive display device 9 of FIGS. 13A and 13B and the transmissive display device 9 further includes spacers 460 located in the aforementioned gap.

Referring to FIGS. 13A and 13B, the spacers 460 are located between the transparent covering layer 430 and the encapsulate layer 300 and can be used to maintain the gap between the transparent covering layer 430 and the encapsulate layer 300. In this embodiment, the hole filling portion 440 is air, and the hole filling portion 440 surrounds the spacers 460.

In some embodiments, the thickness G of the gap between the transparent covering layer 430 and the encapsulate layer 300 is 2 micrometers to 10 micrometers, and the backside light leakage index of the transmissive display device 9 is 0.1412.

In this embodiment, the spacer 460 has a structure that is narrower at the top and wider at the bottom, but the invention is not limited to this. In other embodiments, the spacer 460 has a structure that is wider at the top and narrower at the bottom.

Figure 14:
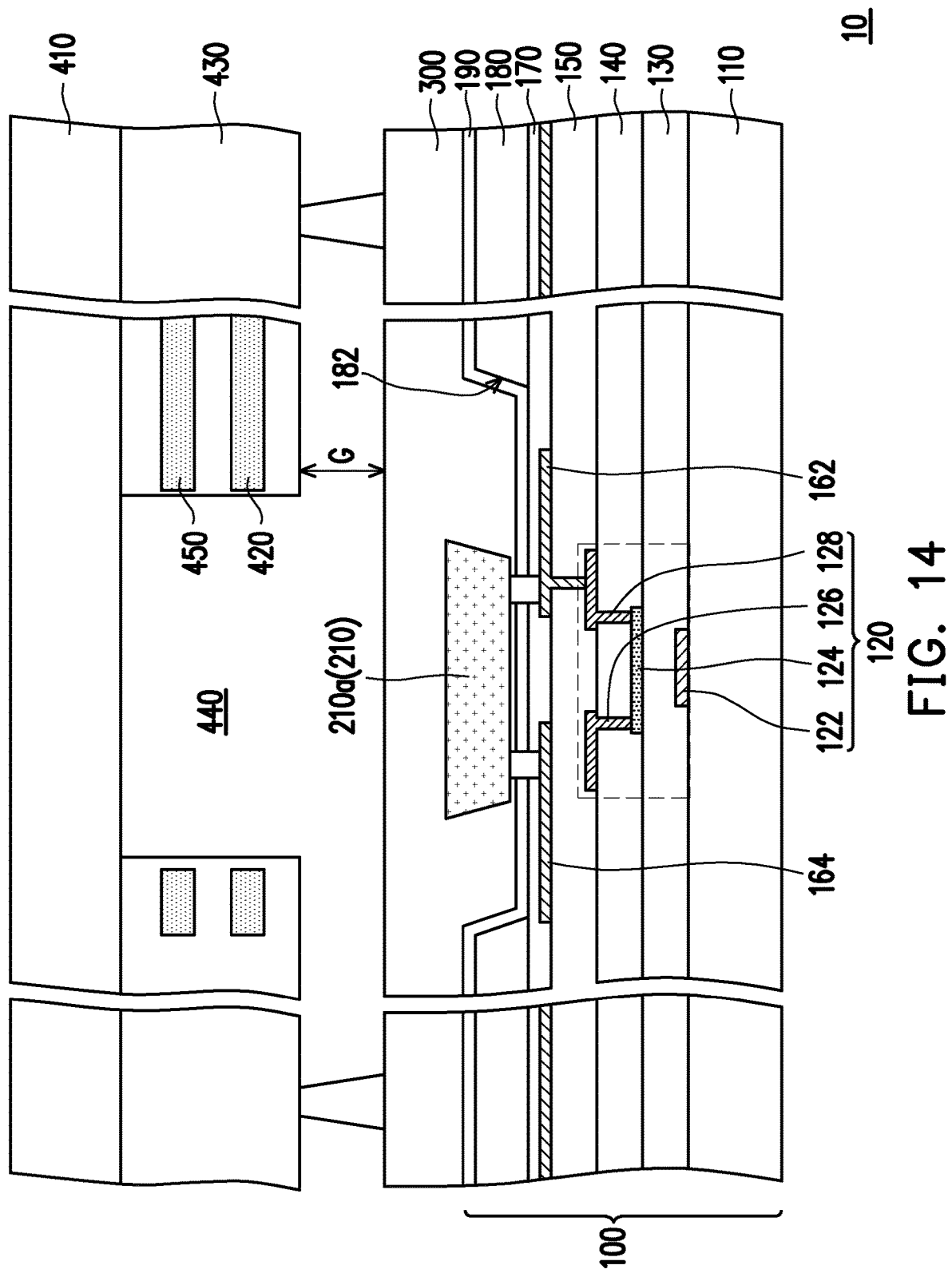
FIG. 14 is a schematic cross-sectional view of a transmissive display device according to an embodiment of the present invention.

FIG. 14 is a schematic cross-sectional view of a transmissive display device 10 according to an embodiment of the present invention. It should be noted herein that, in embodiments provided in FIG. 14, element numerals and partial content of the embodiments provided in FIGS. 13A and 13B are followed, the same or similar reference numerals being used to represent the same or similar elements, and description of the same technical content being omitted. For a description of an omitted part, reference may be made to the foregoing embodiment, and the descriptions thereof are omitted herein.

The main difference between the transmissive display device 10 in FIG. 14 and the transmissive display device 9 in FIG. 13B is that the transmissive display device 10 further includes a plurality of second light-shielding structures 450. The second light-shielding structures 450 are located between the first light-shielding structures 420 and the cover lens 410. The second light-shielding structure 450 has a similar shape to the first light-shielding structure 420. The shape of the second light-shielding structure 450 can refer to the shape of the first light-shielding structure 420 in FIG. 13A.

In some embodiments, the thickness G of the gap between the transparent covering layer 430 and the encapsulate layer 300 is 2 micrometers to 10 micrometers, and the backside light leakage index of the transmissive display device 10 is 0.1129.

Figure 15:
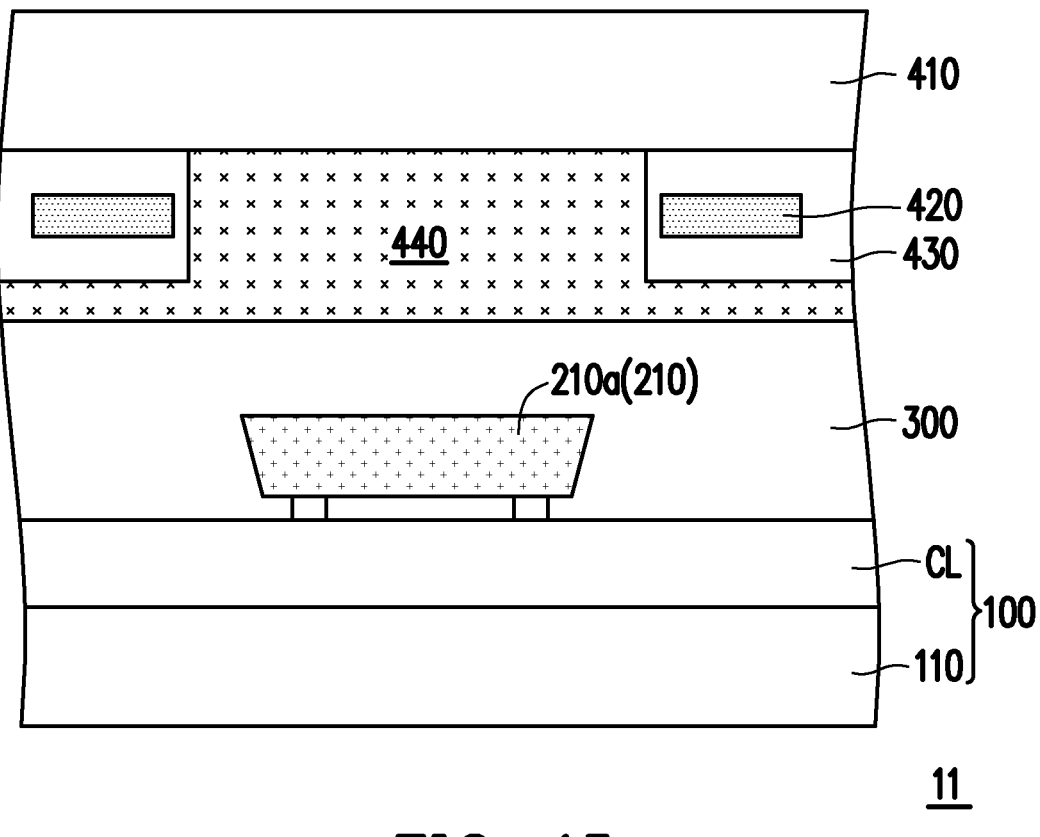
FIG. 15 is a schematic cross-sectional view of a transmissive display device according to an embodiment of the present invention.

FIG. 15 is a schematic cross-sectional view of a transmissive display device 11 according to an embodiment of the present invention. It should be noted herein that, in embodiments provided in FIG. 15, element numerals and partial content of the embodiments provided in FIG. 5 are followed, the same or similar reference numerals being used to represent the same or similar elements, and description of the same technical content being omitted. For a description of an omitted part, reference may be made to the foregoing embodiment, and the descriptions thereof are omitted herein.

The main difference between the transmissive display device 11 of FIG. 15 and the transmissive display device 4 of FIG. 5 is that the material of the hole filling portion 440 of the transmissive display device 4 of FIG. 5 includes air, while the material of the hole filling portion 440 of the transmissive display device 11 of FIG. 15 includes optical clear resin (OCR).

In some embodiments, the material of the hole filling portion 440 includes optical clear resin or other suitable materials, and the refractive index of the hole filling portion 440 is 1.2 to 1.3. In this embodiment, a portion of the hole filling portion 440 is filled between the transparent covering layer 430 and the encapsulate layer 300. In some embodiments, spacers (not shown) are included between the transparent covering layer 430 and the encapsulate layer 300, and the hole filling portion 440 surrounds the spacers.

In some embodiments, the transmissive display device 11 has a backside light leakage index of 0.1388.

Figure 16:
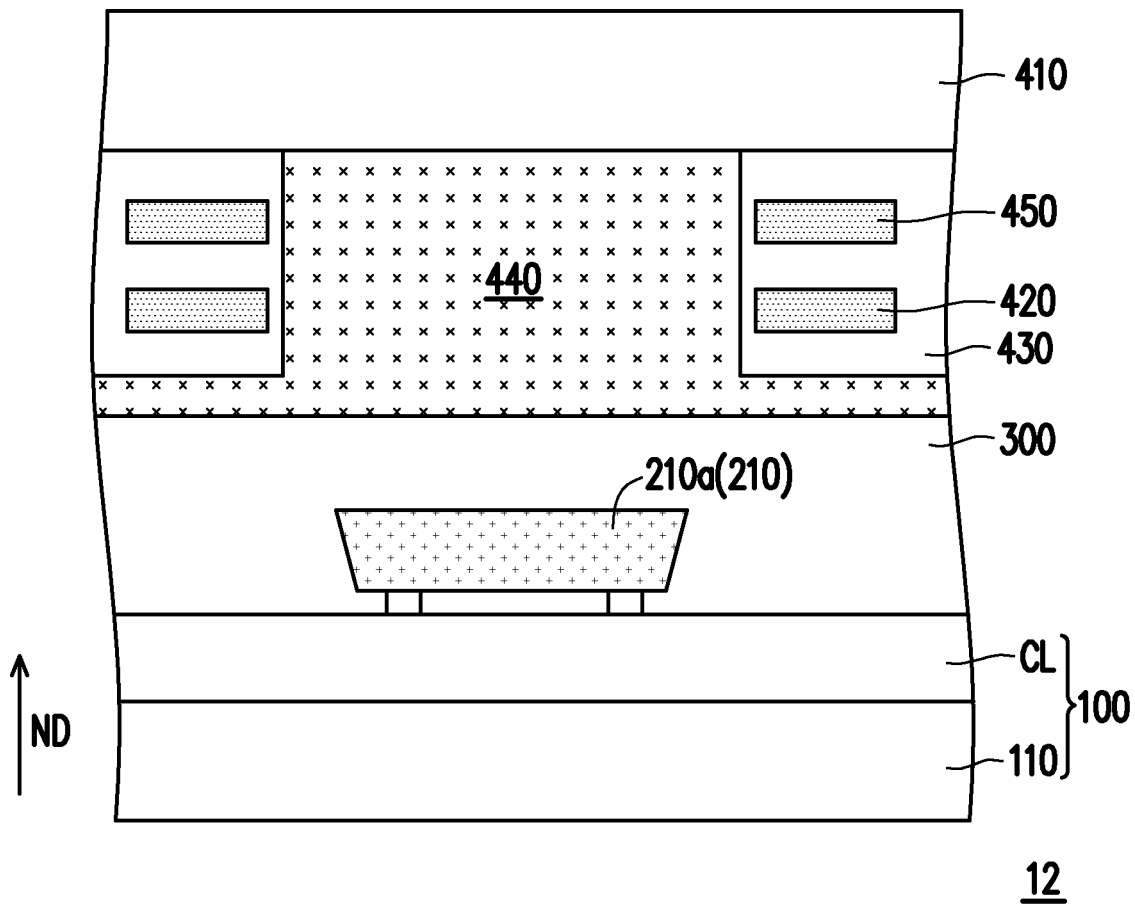
FIG. 16 is a schematic cross-sectional view of a transmissive display device according to an embodiment of the present invention.

FIG. 16 is a schematic cross-sectional view of a transmissive display device 12 according to an embodiment of the present invention. It should be noted herein that, in embodiments provided in FIG. 16, element numerals and partial content of the embodiments provided in FIG. 15 are followed, the same or similar reference numerals being used to represent the same or similar elements, and description of the same technical content being omitted. For a description of an omitted part, reference may be made to the foregoing embodiment, and the descriptions thereof are omitted herein.

The main difference between the transmissive display device 12 in FIG. 16 and the transmissive display device 11 in FIG. 15 is that the transmissive display device 12 further includes a plurality of second light-shielding structures 450. The second light-shielding structures 450 are located between the first light-shielding structures 420 and the cover lens 410. The second light-shielding structure 450 has a similar shape to the first light-shielding structure 420. The shape of the second light-shielding structure 450 can refer to the shape of the first light-shielding structure 420 in FIG. 13A.

In some embodiments, the transmissive display device 12 has a backside light leakage index of 0.0991.

In summary, by setting up the light-shielding structure in the transmissive display device, the transparent covering layer with the holes, and the hole filling portion located in the holes, light with a large viewing angle can be refracted to the position of the light-shielding structure, thereby improving the problem of backlight leakage.

What is claimed is:

1. A transmissive display device, comprising:
a circuit substrate comprising a first transmissive region and a non-transmissive region;
a plurality of pixel units, disposed on the non-transmissive region, wherein each of the plurality of pixel units comprises a plurality of light-emitting diodes;
a plurality of first light-shielding structures, wherein each of the plurality of first light-shielding structures is respectively disposed corresponding to a corresponding one of the plurality of pixel units, and each of the plurality of first light-shielding structures defines a plurality of first transparent regions, and the plurality of first transparent regions are overlapping with the plurality of light-emitting diodes of the corresponding one of the plurality of pixel units;
a transparent covering layer surrounding the plurality of first light-shielding structures, wherein the transparent covering layer has a plurality of holes, and each of the plurality of holes is respectively located in a corresponding one of the plurality of first transparent regions, wherein a refractive index of the transparent covering layer is 1.44 to 1.55;
a hole filling portion located in the plurality of holes, wherein the hole filling portion comprises vacuum, air or optical clear resin, and a refractive index of the hole filling portion is 1 to 1.3; and
a cover lens overlapping with the circuit substrate and has a refractive index of 1.45 to 1.55, wherein the plurality of first light-shielding structures are located between the cover lens and the circuit substrate.

2. The transmissive display device of claim 1, further comprises:

an encapsulate layer, located on the circuit substrate and surrounding the plurality of light-emitting diodes, wherein the plurality of first light-shielding structures and the transparent covering layer are located on the encapsulate layer, and a portion of the encapsulate layer is included between the plurality of first light-shielding structures and the hole filling portion.

3. The transmissive display device of claim 1, wherein the refractive index of the cover lens is greater than the refractive index of the transparent covering layer, and the refractive index of the transparent covering layer is greater than the refractive index of the hole filling portion.

4. The transmissive display device of claim 1, further comprises:

an encapsulate layer, located on the circuit substrate and surrounding the plurality of light-emitting diodes, wherein the plurality of first light-shielding structures and the transparent covering layer are located on the encapsulate layer; and a plurality of black matrix structures, located between the encapsulate layer and the circuit substrate, wherein each of the plurality of black matrix structures is respectively overlapping with a corresponding one of the plurality of first light-shielding structures, and each of the plurality of black matrix structures has a plurality of second transmissive regions, and the plurality of second transmissive regions are respectively overlapping with the plurality of first transparent regions.

5. The transmissive display device of claim 1, further comprises:

a plurality of second light-shielding structures, located between the plurality of first light-shielding structures and the cover lens, wherein the plurality of second light-shielding structures are respectively overlapping with the plurality of first light-shielding structures, and each of the plurality second light-shielding structures has a plurality of second transparent regions, and the plurality of second transparent regions are respectively overlapping with the plurality of first transparent regions, and each of the plurality of holes is respectively located in a corresponding one of the plurality second transparent regions.

6. The transmissive display device of claim 1, further comprises:

an encapsulate layer, located on the circuit substrate and surrounding the plurality of light-emitting diodes, wherein the plurality of first light-shielding structures and the transparent covering layer are located on the encapsulate layer, wherein the plurality of first light-shielding structures are partially extending into the encapsulate layer.

7. The transmissive display device of claim 1, wherein a material of the plurality of first light-shielding structures comprises metal or polymer material.

8. The transmissive display device of claim 1, further comprises:

an encapsulate layer, located on the circuit substrate and surrounding the plurality of light-emitting diodes, wherein the plurality of first light-shielding structures and the transparent covering layer are located on the encapsulate layer; and a spacer, located between the transparent covering layer and the encapsulate layer, wherein the hole filling portion surrounds the spacer.

9. The transmissive display device of claim 1, wherein each of the plurality of first light-shielding structures comprises a plurality of first light-shielding segments separated from each other, and the plurality of first light-shielding segments surround the plurality of first transparent regions.

10. The transmissive display device of claim 1, wherein the transparent covering layer completely covers sidewalls of the plurality of first light-shielding structures.

* * * * *